(12) United States Patent
Kim et al.

(10) Patent No.: US 12,183,857 B2
(45) Date of Patent: Dec. 31, 2024

(54) LIGHT-EMITTING DEVICE AND DISPLAY DEVICE COMPRISING SAME

(71) Applicant: Samsung Display Co., Ltd., Yongin-si (KR)

(72) Inventors: Dong Uk Kim, Yongin-si (KR); Je Won Yoo, Yongin-si (KR); Hyun Min Cho, Yongin-si (KR); Jung Hong Min, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 832 days.

(21) Appl. No.: 17/263,871

(22) PCT Filed: Jan. 30, 2019

(86) PCT No.: PCT/KR2019/001302
§ 371 (c)(1),
(2) Date: Jan. 27, 2021

(87) PCT Pub. No.: WO2020/027401
PCT Pub. Date: Feb. 6, 2020

(65) Prior Publication Data
US 2021/0320231 A1 Oct. 14, 2021

(30) Foreign Application Priority Data
Jul. 30, 2018 (KR) .................... 10-2018-0088716

(51) Int. Cl.
*H01L 33/50* (2010.01)
*H01L 25/16* (2023.01)
(Continued)

(52) U.S. Cl.
CPC ............ *H01L 33/50* (2013.01); *H01L 25/167* (2013.01); *G09G 3/32* (2013.01); *G09G 2300/06* (2013.01);
(Continued)

(58) Field of Classification Search
CPC .......... H01L 33/50; H01L 33/62; H01L 33/36
See application file for complete search history.

(56) References Cited

U.S. PATENT DOCUMENTS

| 7,687,823 B2 * | 3/2010 | Amo ................. H01L 33/505 |
|---|---|---|
| | | 257/E33.056 |
| 9,111,464 B2 | 8/2015 | Bibl et al. |
| | | (Continued) |

FOREIGN PATENT DOCUMENTS

| CN | 107634081 A | 1/2018 |
|---|---|---|
| KR | 10-2004-0029385 A | 4/2004 |
| | (Continued) | |

OTHER PUBLICATIONS

International Search Report for corresponding International Application No. PCT/KR2019/001302, dated May 10, 2019, 3pp.

*Primary Examiner* — Michele Fan
(74) *Attorney, Agent, or Firm* — Lewis Roca Rothgerber Christie LLP

(57) ABSTRACT

A light emitting device may include: a substrate; a light emitting element located on the substrate and configured to emit light; a first electrode and a second electrode spaced from each other with the light emitting element interposed therebetween; a color conversion layer located on the substrate and configured to convert light emitted from the light emitting element into light having a specific color; a first contact electrode configured to electrically couple the first electrode with a first end of the light emitting element; and a second contact electrode configured to electrically couple the second electrode with a second end of the light emitting element. In a plan view, the color conversion layer may be spaced from the light emitting element and overlaps with at least one of the first and the second contact electrodes.

20 Claims, 29 Drawing Sheets

(51) Int. Cl.
  *G09G 3/32*   (2016.01)
  *H01L 33/20*  (2010.01)
  *H01L 33/62*  (2010.01)

(52) U.S. Cl.
  CPC .......... *G09G 2300/08* (2013.01); *H01L 33/20* (2013.01); *H01L 33/62* (2013.01)

(56) References Cited

U.S. PATENT DOCUMENTS

| | | |
|---|---|---|
| 9,515,285 B2 | 12/2016 | Sato |
| 10,340,257 B2 | 7/2019 | Sung et al. |
| 10,340,419 B2 | 7/2019 | Kim et al. |
| 10,468,388 B2 | 11/2019 | Seo et al. |
| 10,672,946 B2 | 6/2020 | Cho et al. |
| 2009/0066259 A1 | 3/2009 | Hwang et al. |
| 2014/0145237 A1 | 5/2014 | Do et al. |
| 2015/0333102 A1 | 11/2015 | Sato |
| 2015/0380612 A1 | 12/2015 | Yang |
| 2016/0218141 A1 | 7/2016 | Cai |
| 2017/0263672 A1 | 9/2017 | Seo et al. |
| 2018/0006091 A1 | 1/2018 | Kuo et al. |
| 2018/0122836 A1* | 5/2018 | Kang ............... H01L 33/60 |
| 2018/0175009 A1* | 6/2018 | Kim ............... H01L 25/167 |
| 2018/0175106 A1 | 6/2018 | Kim et al. |
| 2019/0319168 A1 | 10/2019 | Kim |

FOREIGN PATENT DOCUMENTS

| | | |
|---|---|---|
| KR | 10-2009-0026871 A | 3/2009 |
| KR | 1321933 B1 * | 10/2013 |
| KR | 10-1704334 B1 | 2/2017 |
| KR | 10-2017-0038951 A | 4/2017 |
| KR | 10-1731164 B1 | 4/2017 |
| KR | 10-2017-0106566 A | 9/2017 |
| KR | 10-1782889 B1 | 9/2017 |
| KR | 10-2018-0007376 A | 1/2018 |
| KR | 10-2018-0009014 A | 1/2018 |
| KR | 10-1968527 B1 | 4/2019 |
| KR | 10-2019-0120467 A | 10/2019 |

* cited by examiner

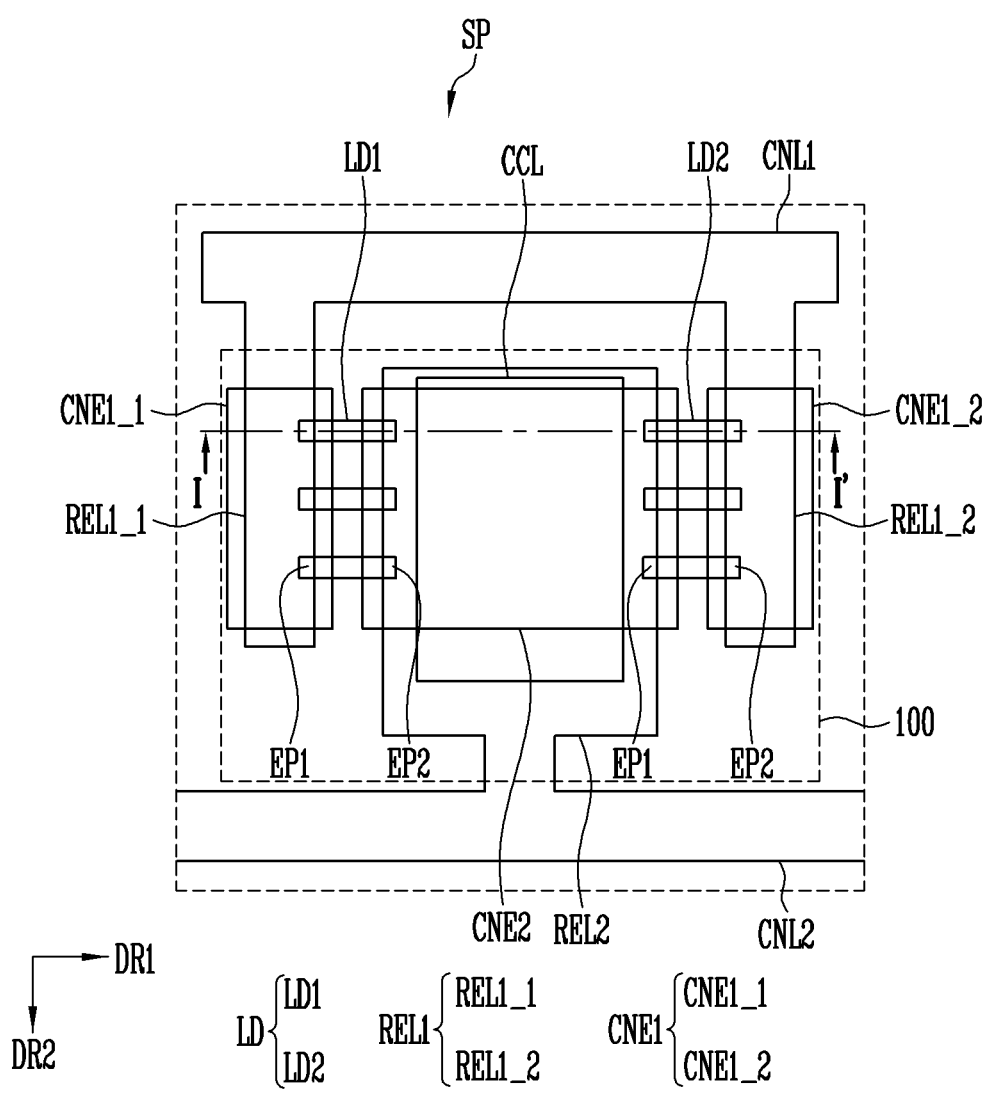

LIGHT-EMITTING DEVICE AND DISPLAY DEVICE COMPRISING SAME

CROSS-REFERENCE TO RELATED APPLICATIONS

This application is a National Phase Patent Application and claims priority to and the benefit of International Application Number PCT/KR2019/001302, filed on Jan. 30, 2019, which claims priority to Korean Patent Application Number 10-2018-0088716, filed on Jul. 30, 2018, the entire contents of all each of which are incorporated herein by reference.

FIELD

Various embodiments of the present disclosure relate to a light emitting device and a display device having the light emitting device.

BACKGROUND

A light emitting diode (LED) may have a relatively satisfactory durability even under poor environmental conditions, and have may excellent performances in terms of lifetime and luminance. Recently, research on the technology of applying such LEDs to various display devices has become appreciably more active.

To apply the LED to a lighting device, a display device, or the like, there is a need to couple the LED to an electrode so that the voltage of the power supply may be applied to the LED. With regard to application purposes of the LED, a method of reducing space needed for the electrode, or a method of fabricating the LED, various researches on arrangement relationship between the LED and the electrode have been conducted.

In addition, various studies for enhancing the display quality by increasing the light output efficiency of the LED in a display device using the LED as a light source have been conducted.

SUMMARY

Various embodiments of the present disclosure are directed to a light emitting device in which the light emitting efficiency of a subminiature light emitting diode may be enhanced, and a display device having the light emitting device.

Technical Solution

According to an aspect of the present disclosure, a light emitting device may include: a substrate; a light emitting element located on the substrate and configured to emit light; a first electrode and a second electrode spaced from each other with the light emitting element interposed therebetween; a color conversion layer located on the substrate and configured to convert light emitted from the light emitting element into light having a specific color; a first contact electrode configured to electrically couple the first electrode with a first end of the light emitting element; and a second contact electrode configured to electrically couple the second electrode with a second end of the light emitting element. In a plan view, the color conversion layer may be spaced from the light emitting element and overlap with at least one of the first and the second contact electrodes.

In an embodiment, the color conversion layer may include a quantum dot. The color conversion layer may overlap with the second contact electrode.

In an embodiment, the color conversion layer may be located on the second electrode and may overlap with the second electrode. The second contact electrode may be located on the color conversion layer.

In an embodiment, the color conversion layer may be located on the second contact electrode.

In an embodiment, the light emitting device may further include: a first connection line extending in a direction and electrically coupled with the first electrode; and a second connection line extending parallel to the direction in which the first connection line extends and electrically coupled with the second electrode. The second electrode may include a 2-1-th electrode and a 2-2-th electrode diverging from the second connection line and spaced from each other. The color conversion layer may be located on the substrate between the 2-1-th electrode and the 2-2-th electrode.

In an embodiment, the light emitting device may further include a dummy electrode located between the substrate and the color conversion layer.

In an embodiment, the light emitting device may further include: a capping insulating layer located on the color conversion layer; and a light block pattern located on the capping insulating layer, the light block pattern corresponding to the light emitting element. The light block pattern may include a black matrix, and the capping insulating layer may include an inorganic insulating layer.

In an embodiment, the light emitting device may further include an auxiliary pattern located between the capping insulating layer and the light block pattern, the auxiliary pattern to correspond to the light emitting element.

In an embodiment, the light emitting device may further include: a first insulating layer between the substrate and the light emitting element; a second insulating layer on the light emitting element and exposing opposite ends of the light emitting element; and a third insulating layer on the second insulating layer covering the light emitting element.

In an embodiment, the first contact electrode and the second contact electrode may be located on the third insulating layer and spaced from each other.

In an embodiment, the first contact electrode and the second contact electrode may be located at different layers.

In an embodiment, the light emitting element may include a light emitting diode having a shape of a cylinder or polyprism and having a microscale or nanoscale size.

According to an aspect of the present disclosure, a display device may include: a substrate including a display area and a non-display area; and a plurality of pixels in the display area of the substrate, each of the pixels including a plurality of sub-pixels. Each of the sub-pixels may include a pixel circuit layer including a transistor, and a display element layer including a unit emission area through which light is emitted.

The display element layer may include: a emitting element on the pixel circuit layer and configured to emit light; a first electrode and a second electrode spaced from each other with the light emitting element interposed therebetween; a color conversion layer located on the substrate and configured to convert light emitted from the light emitting element into light having a specific color; a first contact electrode configured to electrically couple the first electrode with a first end of the light emitting element; and a second contact electrode configured to electrically couple the second electrode with a second end of the light emitting element.

In an embodiment, in a plan view, the color conversion layer may be spaced from the light emitting element and may overlap with at least one of the first and the second contact electrodes.

Advantageous Effects

An embodiment of the present disclosure may provide a light emitting device in which a color conversion layer is on the same substrate as that of a subminiature light emitting element so that the light output efficiency of the light emitting element may be enhanced.

An embodiment of the present disclosure may provide a display device including the light emitting device.

DESCRIPTION OF DRAWINGS

FIG. 2 is a plan diagram illustrating a unit emission area of a light emitting device including a light emitting element of FIG. 1A.

MODE FOR INVENTION

Figure 1A:
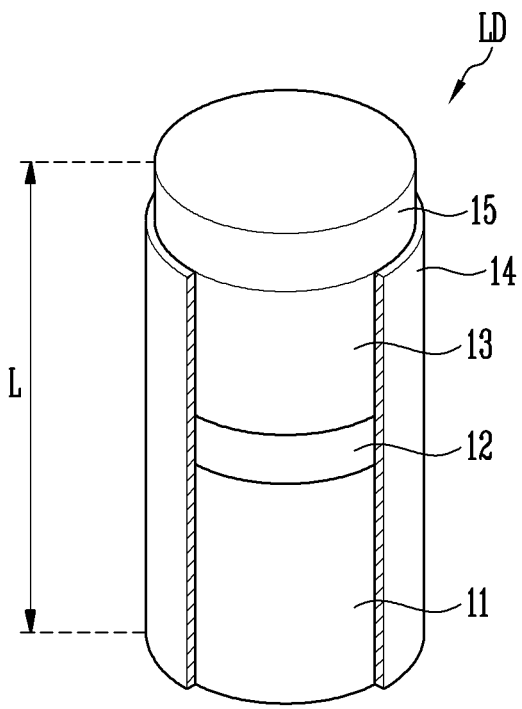
FIGS. 1A and 1B are perspective views illustrating various types of light emitting elements in accordance with one or more example embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, when a first part such as a layer, a film, a region, or a plate is under a second part, the first part may be not only directly under the second part but a third part may intervene between them.

Example Embodiments of the present disclosure will hereinafter be described in detail with reference to the accompanying drawings.

Figure 1B:
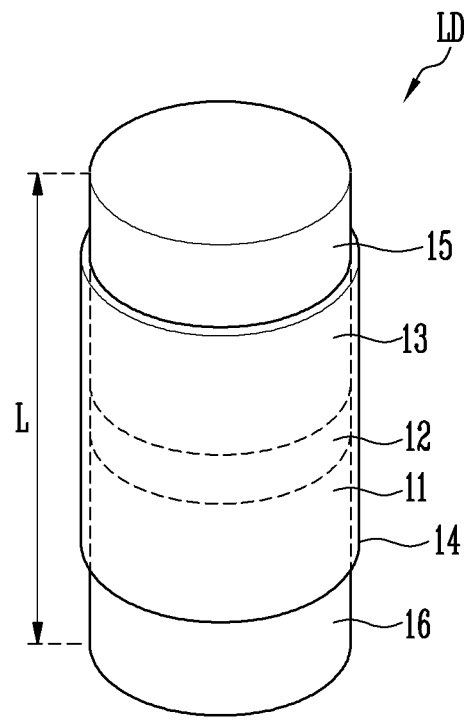

FIGS. 1A and 1B are perspective views illustrating various types of light emitting elements in accordance with embodiments of the present disclosure. Although FIGS. 1A and 1B illustrate cylindrical light emitting elements, the present disclosure is not limited thereto.

Referring to FIGS. 1A and 1B, a light emitting element LD in accordance with an embodiment of the present disclosure may include a first semiconductor layer (or a first conductive semiconductor layer) 11, a second semiconductor layer (or a second conductive semiconductor layer) 13, and an active layer 12 interposed between the first and second conductive semiconductor layers 11 and 13.

For example, the light emitting element LD may be implemented as a stacked body formed by successively stacking the first conductive semiconductor layer 11, the active layer 12, and the second conductive semiconductor layer 13.

In an embodiment of the present disclosure, the light emitting element LD may be provided in the form of a rod extending in one direction. If the direction in which the light emitting element LD extends is defined as a longitudinal direction, the light emitting element LD may have a first end and a second end in the extension direction.

One of the first and second conductive semiconductor layers 11 and 13 may be disposed on the first end, and the other one of the first and second conductive semiconductor layers 11 and 13 may be disposed on the second end.

Although the light emitting element LD may be provided in the form of a cylinder, the present disclosure is not limited thereto. The light emitting element LD may include a rod-like shape or a bar-like shape extending in the longitudinal direction (i.e., to have an aspect ratio greater than 1). For example, a length L of the light emitting element LD in the longitudinal direction may be greater than the diameter thereof.

The light emitting element LD may include a light emitting diode fabricated in a subminiature size having a diameter and/or length corresponding to, e.g., a microscale or nanoscale size.

However, the size of the light emitting element LD is not limited thereto, and the size of the light emitting element LD may be changed to meet requirements of a lighting device or a self-emissive display device to which the light emitting element LD is applied.

The first conductive semiconductor layer 11 may include, e.g., at least one n-type semiconductor layer. For instance, the first conductive semiconductor layer 11 may include a semiconductor layer which includes any one semiconductor material from among InAlGaN, GaN, AlGaN, InGaN, AlN, and InN, and is doped with a first conductive dopant, such as, Si, Ge, or Sn.

The material forming the first conductive semiconductor layer 11 is not limited to this, and the first conductive semiconductor layer 11 may be formed of various other materials.

The active layer 12 may be formed on the first conductive semiconductor layer 11 and have a single- or multi-quantum well structure. In an embodiment of the present disclosure, a cladding layer (not shown) doped with a conductive dopant may be formed on and/or under the active layer 12. For example, the cladding layer may be formed of an AlGaN layer or an InAlGaN layer. In some embodiments, material such as AlGaN or AlInGaN may be employed to form the active layer 12.

If an electric field (e.g., an electric field of a predetermined voltage or more) is applied between the opposite ends of the light emitting element LD, the light emitting element LD emits light by coupling of electron-hole pairs in the active layer 12.

The second conductive semiconductor layer 13 may be provided on the active layer 12 and may include a semiconductor layer having a type different from that of the first conductive semiconductor layer 11. For example, the second conductive semiconductor layer 13 may include at least one p-type semiconductor layer. For instance, the second conductive semiconductor layer 13 may include a semiconductor layer which includes any one semiconductor material from among InAlGaN, GaN, AlGaN, InGaN, AlN, and InN, and is doped with a second conductive dopant such as Mg.

The material forming the second conductive semiconductor layer 13 is not limited to this, and the second conductive semiconductor layer 13 may be formed of various other materials.

In an embodiment of the present disclosure, the light emitting element LD may further include one electrode layer 15 disposed on the second conductive semiconductor layer 13, as illustrated in FIG. 1A, as well as including the first conductive semiconductor layer 11, the active layer 12, and the second conductive semiconductor layer 13. Furthermore, in an embodiment, as shown in FIG. 1B, the light emitting element LD may further include another electrode layer 16 disposed on one end of the first conductive semiconductor layer 11 as well as including the electrode layer 15.

Although each of the electrode layers 15 and 16 may be formed of an ohmic contact electrode, the present disclosure is not limited thereto. Furthermore, each of the electrode layers 15 and 16 may include metal or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited to this.

Materials included in the respective electrode layers 15 and 16 may be to the same or different from each other.

The electrode layers 15 and 16 may be transparent or semitransparent. Therefore, light generated from the light emitting element LD may pass through the electrode layers 15 and 16 and then be emitted outside the light emitting element LD.

In an embodiment of the present disclosure, the light emitting element LD may further include an insulating film 14. In an embodiment of the present disclosure, the insulating film 14 may be omitted, or may be provided to cover only some of the first conductive semiconductor layer 11, the active layer 12, and the second conductive semiconductor layer 13.

As illustrated in FIG. 1A, the insulating film 14 may be provided on a portion of the light emitting element LD other than one of opposite ends of the light emitting element LD. For example, the insulating film 14 may expose only the one electrode layer 15 disposed on one end of the second conductive semiconductor layer 13 of the light emitting element LD and enclose the overall side surfaces of the components other than the electrode layer 15. Here, the insulating film 14 may allow at least the opposite ends of the light emitting element LD to be exposed to the outside. For example, the insulating film 14 may allow not only the electrode layer 15 disposed on one end of the second conductive semiconductor layer 13 but also one end of the first conductive semiconductor layer 11 to be exposed to the outside.

In an embodiment, as shown in FIG. 1B, in the case where the electrode layers 15 and 16 are disposed on the respective opposite ends of the light emitting element LD, the insulating film 14 may allow at least a portion of each of the electrode layers 15 and 16 to be exposed to the outside. Alternatively, in an embodiment, the insulating film 14 may not be provided.

In an embodiment of the present disclosure, the insulating film 14 may include a transparent insulating material. For example, the insulating film 14 may include at least one insulating material selected from the group consisting of SiO$_2$, Si$_3$N$_4$, Al$_2$O$_3$, and TiO$_2$, but it is not limited thereto. In other words, various materials having insulating properties may be employed.

If the insulating film 14 is provided on the light emitting element LD, the active layer 12 may be prevented from short-circuiting with a first electrode and/or a second electrode which is not illustrated.

Furthermore, thanks to the insulating film 14, occurrence of a defect on the surface of the light emitting element LD may be reduced or minimized, whereby the lifetime and efficiency of the light emitting element LD may be improved. In the case where a plurality of light emitting elements LD are disposed in close contact with each other, the insulating film 14 may prevent an undesired short-circuit from occurring between the light emitting elements LD.

The light emitting element LD may be employed as a light source for various display devices. The light emitting element LD may be fabricated through a surface treatment process.

Figure 3A:
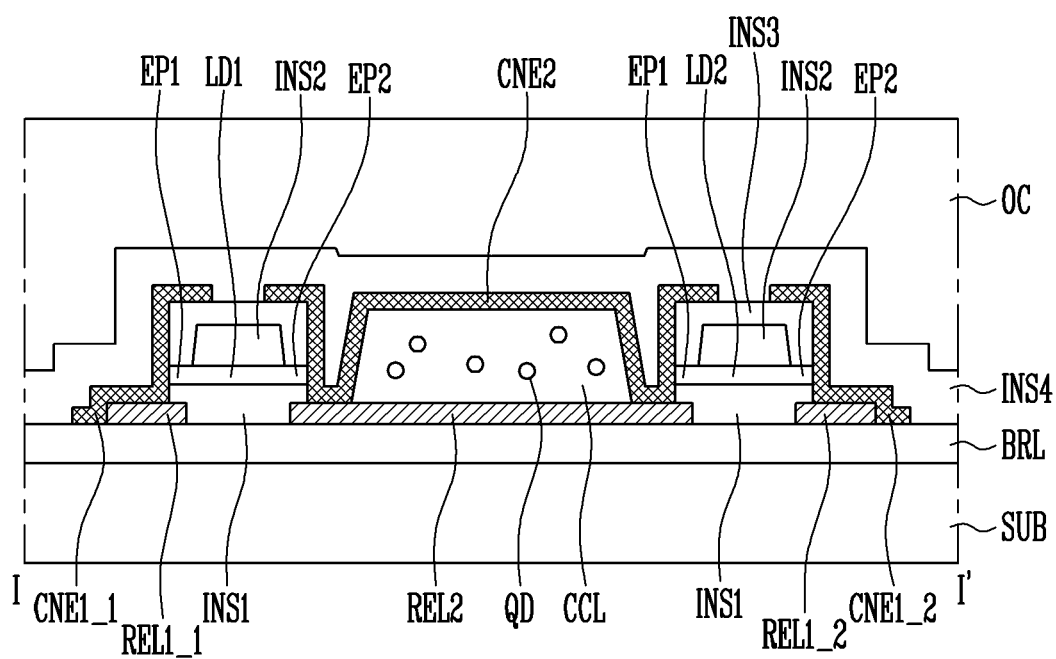
FIG. 3A is a sectional diagram taken along the line I-I' of FIG. 2.

FIG. 2 is a plan diagram illustrating a unit emission area of a light emitting device including the light emitting element of FIG. 1A. FIG. 3A is a sectional diagram taken along the line I-I' of FIG. 2.

Although for convenience sake FIG. 2 illustrates that a plurality of light emitting elements are aligned in a horizontal direction, the alignment of the light emitting elements is not limited thereto.

In FIG. 2, the unit emission area may be a pixel area of one sub-pixel included in the light emitting device.

Referring to FIGS. 1A, 2, and 3A, the light emitting device in accordance with an embodiment of the present disclosure may include a substrate SUB on which at least one sub-pixel SP having a unit emission area 100 is provided, and a plurality of light emitting elements LD (e.g., LD1, LD2) provided on the substrate SUB.

The substrate SUB may include an insulating material such as glass, an organic polymer, or crystal. Furthermore, the substrate SUB may be made of material having flexibility so as to be bendable or foldable, and have a single-layer or multi-layer structure.

For example, the substrate SUB may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the substrate SUB may be changed in various ways.

A barrier layer BRL for preventing impurities from diffusing into the light emitting elements LD may be provided on the substrate SUB.

In an embodiment of the present disclosure, each of the light emitting elements LD (e.g., LD1, LD2) may be formed of a light emitting diode which is made of material having an inorganic crystal structure and has a subminiature size, e.g., corresponding to a nanoscale or microscale.

Each of the light emitting elements LD (e.g., LD1, LD2) may include a first conductive semiconductor layer 11, a second conductive semiconductor layer 13, and an active layer 12 interposed between the first and second conductive semiconductor layers 11 and 13. In some embodiments, each of the light emitting elements LD may further include an electrode layer 15 provided on one side of the second conductive semiconductor layer 13.

Each of the light emitting elements LD (e.g., LD1, LD2) may include a first end EP1 and a second end EP2. One of the first and second conductive semiconductor layers 11 and 13 may be disposed on the first end EP1, and the other one of the first and second conductive semiconductor layers 11 and 13 may be disposed on the second end EP2.

A second insulating layer INS2 for covering a portion of an upper surface of each of the light emitting elements LD (e.g., LD1, LD2) may be provided on the light emitting elements LD (e.g., LD1, LD2). Hence, the opposite ends EP1 and EP2 of each of the light emitting elements LD (e.g., LD1, LD2) may be exposed to the outside.

A first insulating layer INS1 may be provided between each of the light emitting elements LD (e.g., LD1, LD2) and the substrate SUB. For example, the first insulating layer INS1 may be provided between each of the light emitting element (e.g., LD1, LD2) and the barrier layer BRL located on the substrate SUB. The first insulating layer INS1 may fill in space between the substrate SUB and each of the light emitting elements LD (e.g., LD1, LD2) to stably support the light emitting elements LD (e.g., LD1, LD2) and prevent the light emitting elements LD (e.g., LD1, LD2) from being removed from the substrate SUB. The first insulating layer INS1 may be formed of an inorganic insulating layer including inorganic material, or an organic insulating layer including organic material.

First and second connection lines CNL1 and CNL2, first and second electrodes REL1 and REL2, and first and second contact electrodes CNE1 and CNE2 may be formed and/or provided in the unit emission area 100 of the sub-pixel SP.

The first connection line CNL1 may extend from the sub-pixel SP in a first direction DR1. The first connection line CNL1 may be provided only in the sub-pixel SP so that the sub-pixel SP may be electrically separated from sub-pixels adjacent thereto. Hence, the sub-pixel SP may be driven independently from the sub-pixels adjacent thereto.

The second connection line CNL2 may extend in a direction parallel to a direction in which the first connection line CNL1 extends. The second connection line CNL2 may extend not only to the sub-pixel SP but also to the sub-pixels adjacent to the sub-pixel SP. Hence, the sub-pixel SP and the sub-pixels adjacent thereto may be coupled in common to the second connection line CNL2.

The first electrode REL1 may include a 1-1-th electrode REL1_1 and a 1-2-th electrode REL1_2 which diverge from the first connection line CNL1 in a second direction DR2 intersecting with (or crossing) the first direction DR1. The 1-1-th electrode REL1_1, the 1-2-th electrode REL1_2, and the first connection line CNL1 may be integrally provided and electrically and/or physically coupled to each other. Each of the 1-1-th electrode REL1_1 and the 1-2-th electrode REL1_2 may have a bar shape extending in the second direction DR2 in a plan view.

In a plan view, the second electrode REL2 may be provided between the 1-1-th electrode REL1_1 and the 1-2-th electrode REL1_2 and may be spaced (e.g., spaced by predetermined distance) from each of the 1-1-th electrode REL1_1 and the 1-2-th electrode REL1_2. The 1-1-th electrode REL1_1, the 1-2-th electrode REL1_2, and the second electrode REL2 may be alternately disposed on the substrate SUB.

Before the light emitting elements LD are aligned in the sub-pixel SP, a first alignment voltage may be applied to the first electrode REL1 through the first connection line CNL1, and a second alignment voltage may be applied to the second electrode REL2 through the second connection line CNL2. The first alignment voltage and the second alignment voltage may have different voltage levels.

As alignment voltages (e.g., predetermined alignment voltages) having different voltage levels are respectively applied to the first electrode REL1 and the second electrode REL2, an electric field may be formed between the first electrode REL1 and the second electrode REL2. The light emitting elements LD may be aligned on the substrate SUB between the first electrode REL1 and the second electrode REL2 by the electric field.

The first and second electrodes REL1 and REL2 may be provided on the substrate SUB at positions spaced from each other with the light emitting elements LD interposed therebetween.

In an embodiment of the present disclosure, the first electrode REL1 may be disposed adjacent to one of the opposite ends EP1 and EP2 of each of the light emitting elements LD, and may be electrically coupled to the light emitting elements LD through the first contact electrode CNE1 (CNE1_1 or CNE1_2). The second electrode REL2 may be disposed adjacent to the other one of the opposite ends EP1 and EP2 of each of the light emitting elements LD, and may be electrically coupled to the light emitting elements LD through the second contact electrode CNE2.

The first electrode REL1 and the second electrode REL2 may be disposed at the same plane, and may have the same height. If the first electrode REL1 and the second electrode REL2 have the same height, each of the light emitting elements LD may be more reliably coupled to the first and second electrodes REL1 and REL2.

The first and second electrodes REL1 and REL2 may be formed of a conductive material. The conductive material may include a metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

Each of the first and second electrodes REL1 and REL2 may have a single layer structure, but the present disclosure is not limited thereto, for example, it may have a multilayer structure formed by stacking two or more materials of metals, alloys, conductive oxides, and conductive polymers.

The material of the first and second electrodes REL1 and REL2 is not limited to the above-mentioned materials. For example, the first and second electrodes REL1 and REL2 may be made of a conductive material having a reflectivity (e.g., predetermined reflectivity) to allow light emitted from the opposite ends EP1 and EP2 of the light emitting elements LD to travel in a direction (e.g., in a frontal direction) in which an image is displayed.

In an embodiment of the present disclosure, the first and second electrodes REL1 and REL2 may function as driving electrodes for driving each of the light emitting elements LD after the light emitting elements LD have been aligned in the sub-pixel SP. The first and second electrodes REL1 and REL2 may function as reflective electrodes for reflecting light emitted from each of the light emitting elements LD (e.g., LD1, LD2) in the frontal direction.

Although for the sake of explanation, the first and second electrodes REL1 and REL2 are illustrated as being directly provided on the substrate SUB (e.g., the first and second electrodes REL and REL2 are illustrated as being directly provided on the barrier BRL located on the substrate SUB), the present disclosure is not limited thereto. For example, a component for enabling the display device to be driven as a passive matrix or an active matrix may be further provided between the substrate SUB and the first and second electrodes REL1 and REL2.

In the case where the light emitting device is driven as the active matrix, for example, signal lines, an insulating layer, and/or a transistor may be provided between the substrate SUB and the first and second electrodes REL1 and REL2.

The signal lines may include a scan line, a data line, a power line, etc. The transistor may be coupled to the signal lines and may include a gate electrode, a semiconductor layer, a source electrode, and a drain electrode.

Any one of the first and second electrodes REL1 and REL2 may be an anode electrode, and the other one of the first and second electrodes REL1 and REL2 may be a cathode electrode. In some embodiments of the present disclosure, the first electrode REL1 may be an anode electrode, and the second electrode REL2 may be a cathode electrode.

For example, one electrode of the source and drain electrodes of the transistor may be coupled to any one electrode of the first and second electrodes REL1 and REL2. A data signal of the data line may be applied to the any one electrode of the first and second electrode REL1 and REL2 through the transistor. Here, the numbers and shapes of signal lines, insulating layer, and/or transistors may be changed in various ways.

In an embodiment of the present disclosure, the first electrode REL1 may be electrically coupled to the transistor through a contact hole (not illustrated). Hence, a signal provided to the transistor may be applied to the first electrode REL1.

Furthermore, in the case where the light emitting device is driven as an active matrix, the second electrode REL2 may be electrically coupled to the signal line through the contact hole (not illustrated). Hence, a voltage of the signal line may be applied to the second electrode REL2.

In an embodiment of the present disclosure, the light emitting elements LD may be divided into a plurality of first light emitting elements LD1 aligned between the 1-1-th electrode REL1_1 and the second electrode REL2, and a plurality of second light emitting elements LD2 aligned between the second electrode REL2 and the 1-2-th electrode REL1_2.

A first end EP1 of each of the first light emitting elements LD1 may be electrically coupled to the 1-1-th electrode REL1_1 through the first contact electrode CNE1 (e.g., 1-1th contact electrode CNE1_1). Hence, a signal of the transistor may be transmitted to the first end EP1 of each of the first light emitting elements LD1. A second end EP2 of each of the first light emitting elements LD1 may be electrically coupled to the second electrode REL2 through the second contact electrode CNE2. Hence, a voltage of the signal line may be transmitted to the second end EP2 of each of the first light emitting elements LD1.

A first end EP1 of each of the second light emitting elements LD2 may be electrically coupled to the second electrode REL2 through the second contact electrode CNE2. Hence, a voltage of the signal line may be transmitted to the first end EP1 of each of the second light emitting elements LD2. A second end EP2 of each of the second light emitting elements LD2 may be electrically coupled to the 1-2-th electrode REL1_2 through the first contact electrode CNE1 (e.g., 1-2th contact electrode CNE1_2). Hence, a signal of the transistor may be transmitted to the second end EP2 of each of the second light emitting elements LD2.

The first and second light emitting elements LD1 and LD2 may constitute a light source of the sub-pixel SP. For example, if driving current flows through the sub-pixel SP during each frame period, the light emitting elements LD coupled to the first and second electrodes REL1 and REL2 of the sub-pixel SP may emit light having a luminance corresponding to the driving current.

The first contact electrode CNE1 may be provided on the first electrode REL1 to electrically and/or physically reliably couple the first electrode REL1 with one end of the opposite ends EP1 and EP2 of each of the light emitting elements LD (e.g., LD1, LD2).

The first contact electrode CNE1 may be formed of transparent conductive material to allow light emitted from each of the light emitting elements LD and reflected by the first electrode REL1 to travel in the frontal direction without loss. For example, the transparent conductive material may include ITO, IZO, ITZO, etc. The material of the first contact electrode CNE1 is not limited to the above-mentioned materials.

In a plan view, the first contact electrode CNE1 may cover the first electrode REL1 and overlap with the first electrode REL1. Furthermore, the first contact electrode CNE1 may partially overlap with one of the opposite ends EP1 and EP2 of each of the light emitting elements LD (e.g., LD1, LD2).

In an embodiment of the present disclosure, the first contact electrode CNE1 may include a 1-1-th contact electrode CNE1_1 provided on the 1-1-th electrode REL1_1, and a 1-2-th contact electrode CNE1_2 provided on the 1-2-th electrode REL1_2.

In a plan view, the 1-1-th contact electrode CNE1_1 may overlap with the first end EP1 of each of the first light emitting elements LD1 and the 1-1-th electrode REL1_1. In a plan view, the 1-2-th contact electrode CNE1_2 may overlap with the second end EP2 of each of the second light emitting elements LD2 and the 1-2-th electrode REL1_2.

The second contact electrode CNE2 may be provided on the second electrode REL2. In a plan view, the second contact electrode CNE2 may cover the second electrode REL2 and overlap with the second electrode REL2. Furthermore, the second contact electrode CNE2 may overlap with the second end EP2 of each of the first light emitting elements LD1 and the first end EP1 of each of the second light emitting elements LD2.

The second contact electrode CNE2 may be made of the same material as that of the first contact electrode CNE1, but the present disclosure is not limited thereto.

The first contact electrode CNE1 and the second contact electrode CNE2 may be provided at the same plane, and may be disposed on the third insulating layer INS3 and spaced from each other (e.g., from each other by a predetermined distance) so that the first and second contact electrodes CNE1 and CNE2 can be electrically separated from each other. In an embodiment of the present disclosure, the first contact electrode CNE1 may overlap with one side surface of the third insulating layer INS3, and the second contact electrode CNE2 may overlap with the other side surface of the third insulating layer INS3.

The third insulating layer INS3 may be provided on the second insulating layer INS2 and may cover an exposed portion of the upper surface of each of the light emitting elements LD, thus functioning planarizing a stepped portion between the second insulating layer INS2 and the light emitting element LD. Although the third insulating layer INS3 may include an organic insulating layer formed of organic material, the present disclosure is not limited thereto. In an embodiment, the third insulating layer INS3 may include an inorganic insulating layer formed of inorganic material.

A fourth insulating layer INS4 may be provided on the substrate SUB including the first and second contact electrodes CNE1 and CNE2. The fourth insulating layer INS4 may prevent the first and second contact electrodes CNE1 and CNE2 from being exposed to the outside, thus preventing the first and second contact electrodes CNE1 and CNE2 from being corroded. Although the fourth insulating layer INS4 may be formed of a single layer as shown in FIG. 3A, the present disclosure is not limited thereto. In an embodiment, the fourth insulating layer INS4 may be formed of multiple layers.

An overcoat layer OC may be provided on the fourth insulating layer INS4.

The overcoat layer OC may be a planarization layer for mitigating a step difference formed by the first and second electrodes REL1 and REL2, the first and second contact electrodes CNE1 and CNE2, etc. that are disposed under the overcoat layer OC. For example, the overcoat layer OC may be an encapsulation layer for preventing oxygen or water from penetrating into the light emitting elements LD.

In some embodiments, the overcoat layer OC may be omitted. In the case where the overcoat layer OC is omitted, the fourth insulating layer INS4 may function as an encapsulation layer for preventing oxygen or water from penetrating into the light emitting elements LD.

As described above, voltages (e.g., predetermined voltages) may be respectively applied to the opposite ends EP1 and EP2 of each of the first light emitting elements LD1 through the 1-1-th electrode REL1_1 and the second electrode REL2. Hence, each of the first light emitting elements LD1 may emit light by coupling of electron-hole pairs in the active layer 12 of each of the first light emitting elements LD1.

Furthermore, voltages (e.g., predetermined voltages) may be respectively applied to the opposite ends EP1 and EP2 of each of the second light emitting elements LD2 through the second electrode REL2 and the 1-2-th electrode REL1_2. Hence, each of the second light emitting elements LD2 may emit light by coupling of electron-hole pairs in the active layer 12 of each of the second light emitting elements LD2.

A color conversion layer CCL may be disposed in the unit emission area 100 of the sub-pixel SP.

The color conversion layer CCL may convert light emitted from each of the light emitting elements LD into light having a specific color, and then emit the light. For example, if the light emitting elements LD emit blue light, the color conversion layer CCL may convert the blue light into light having a specific color depending on a corresponding sub-pixel.

To this end, the color conversion layer CCL may be configured in the form where at least one kind of photoconversion particles are distributed in transparent resin. In an embodiment of the present disclosure, the photoconversion particles may be quantum dots QD.

For example, in the case where the sub-pixel SP is a red sub-pixel and the light emitting elements LD provided in the sub-pixel SP are light emitting elements configured to emit light having a color other than red, for example, blue light, the color conversion layer CCL may include red quantum dots QD as the photoconversion particles.

If the blue light is drawn into the color conversion layer CCL including the red quantum dots QD, the color conversion layer CCL may absorb the blue light, shift the wavelength of the light by an energy transition, and emit red light having a wavelength ranging from approximately 620 nm to approximately 680 nm.

Furthermore, in the case where the sub-pixel SP is a green sub-pixel and the light emitting elements LD provided in the sub-pixel SP are light emitting elements configured to emit light having a color other than green, for example, blue light, the color conversion layer CCL may include green quantum dots QD as the photoconversion particles.

If the blue light is drawn into the color conversion layer CCL including the green quantum dots QD, the color conversion layer CCL may absorb the blue light, shift the wavelength of the light by an energy transition, and emit green light having a wavelength ranging from approximately 500 nm to approximately 560 nm.

The red quantum dots QD and the green quantum dots QD may be selected from among a group II-VI compound, a group III-V compound, a group IV-VI compound, a group IV element, a group IV compound, and a combination thereof.

The group II-VI compound may be selected from the group consisting of: a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quanternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. A group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quanternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quanternary compound selected from the group consisting of SnPbSSe, SnPbSeTe, SnPbSTe, and a mixture thereof. The group IV element may be selected from the group consisting of Si, Ge, and a mixture thereof. The group IV compound may be a binary compound selected from the group consisting of SiC, SiGe, and a mixture thereof.

The binary compound, the ternary compound, or the quaternary compound may be present in particles at a substantially uniform concentration, or may be present in the same particles with partially different concentration distributions. Furthermore, the red quantum dots QD and the green quantum dots QD each may have a core/shell structure in which one quantum dot is surrounded by other quantum dots. An interface between the core and the shell may have a concentration gradient in which the concentration of elements that are present in the shell decreases in a direction from the surface of the particle to the center of the particle.

The red quantum dot QD and the green quantum dot QD may have any shape which is generally used in the art, and is not specifically limited. For example, a spherical, pyramid-shaped, multi-arm shaped, or cubic nanoparticle, nanotube, nanowire, nanofiber, and nanoplate particle may be used.

For the convenience sake, the case where the sub-pixel SP is a red sub-pixel, the color conversion layer CCL includes red quantum dots QD, the first and second light emitting elements LD1 and LD2 provided in the sub-pixel SP emit the blue light will be described as a representative example.

The color conversion layer CCL may be provided on the substrate SUB between the first light emitting elements LD1 and the second light emitting elements LD2 in the unit emission area 100 of the sub-pixel SP.

In an embodiment of the present disclosure, the color conversion layer CCL may be provided on the second electrode REL2, but the present disclosure is not limited thereto. In an embodiment, the color conversion layer CCL may be directly provided on the substrate SUB.

In a plan view, the color conversion layer CCL may overlap with the second electrode REL2 and the second contact electrode CNE2. In a sectional view, the second contact electrode CNE2 may overlap with the second electrode REL2 on opposite ends of the color conversion layer CCL with the color conversion layer CCL provided under the second contact electrode CNE2 and thus be electrically and/or physically coupled with the second electrode REL2. For example, in some embodiments, the color conversion layer CCL may be interposed between the second contact electrode CNE2 and the second electrode REL2.

The color conversion layer CCL may be formed and/or provided in the unit emission area 100 of the sub-pixel SP by an exposure method or the like.

As described above, if voltages (e.g., predetermined voltages) are applied to the opposite ends EP1 and EP2 of each of the first and second light emitting elements LD1 and LD2 through the first and second electrodes REL1 and REL2, each of the first and second light emitting elements LD1 and LD2 may emit the blue light. The blue light emitted from each of the first and second light emitting elements LD1 and LD2 may travel to the color conversion layer CCL.

If the blue light is drawn into the color conversion layer CCL, the red quantum dots QD may be excited so that the blue light can be absorbed and the red light can be emitted. The red light emitted from the red quantum dots QD may be emitted in all directions.

The red light that is eventually emitted from the color conversion layer CCL may be reflected in the frontal direction of the light emitting device by the second electrode REL2 disposed under the color conversion layer CCL. Furthermore, the red light emitted from the color conversion layer CCL may be reflected in the frontal direction of the light emitting device by the 1-1-th and 1-2-th electrodes REL1_1 and REL1_2 disposed adjacent to the color conversion layer CCL.

Hereinafter, the configuration of the light emitting device according to an embodiment of the present disclosure will be described in a stacking sequence with reference to FIGS. 2 and 3A.

The first and second electrodes REL1 and REL2 may be provided on the substrate SUB on which the barrier layer BRL is provided. For example, the first and second electrodes REL1 and REL2 may be provided on the barrier layer BRL. The first electrode REL1 and the second electrode REL2 may be disposed on the substrate SUB at positions spaced from each other (e.g., spaced from each other by a predetermined distance).

The first insulating layer INS1 may be provided on the first electrode REL1 and the second electrode REL2. The first insulating layer INS1 may be formed of an inorganic insulating layer including inorganic material, or an organic insulating layer including organic material.

In an embodiment, a capping electrode (not illustrated) may be provided between the first electrode REL1 and the first insulating layer INS1, and between the second electrode REL2 and the first insulating layer INS1. The capping electrode may prevent the first electrode REL1 and the second electrode REL2 from being damaged because of defects or the like caused during the process of fabricating the light emitting device. The capping electrode may further reinforce adhesive force between the substrate SUB and each of the first and second electrodes REL1 and REL2.

The light emitting elements LD may be aligned on the first insulating layer INS1.

The second insulating layer INS2 may be provided on the light emitting elements LD (e.g., LD1, LD2). The second insulating layer INS2 may be provided on a portion of the upper surface of each of the light emitting elements LD (e.g., LD1, LD2) such that the opposite ends EP1 and EP2 of each of the light emitting elements LD (e.g., LD1, LD2) may be exposed. The second insulating layer INS2 may be formed of an inorganic insulating layer including inorganic material, or an organic insulating layer including organic material.

The third insulating layer INS3 may be provided on the second insulating layer INS2. The third insulating layer INS3 may function to planarize a stepped portion formed by the second insulating layer INS2 and the light emitting elements LD.

The color conversion layer CCL may be provided on the substrate SUB that includes the third insulating layer INS3. The color conversion layer CCL may be formed and/or provided on the second electrode REL2 on the substrate SUB. For example, the color conversion layer CCL may be provided on the second electrode REL2 between the first light emitting elements LD1 and the second light emitting elements LD2.

The first and second contact electrodes CNE1 and CNE2 may be provided on the third insulating layer INS3. The first contact electrode CNE1 may be provided on one side surface of the third insulating layer INS3 and partially overlap with the third insulating layer INS3. The second contact electrode CNE2 may be provided on the other side surface of the third insulating layer INS3 and partially overlap with the third insulating layer INS3. Furthermore, the second contact electrode CNE2 may be provided on the color conversion layer CCL and overlap with the color conversion layer CCL and the second electrode REL2.

The first contact electrode CNE1 and the second contact electrode CNE2 may be provided on the third insulating layer INS3 and may be spaced from each other (e.g., spaced from each other by a predetermined distance) so that the first and second contact electrodes CNE1 and CNE2 can be electrically and/or physically separated from each other.

The fourth insulating layer INS4 may be provided on the first and second contact electrodes CNE1 and CNE2. An overcoat layer OC may be provided on the fourth insulating layer INS4.

As described above, the light emitting device in accordance with an embodiment of the present disclosure may emit light having excellent color reproducibility through the color conversion layer CCL including the red quantum dots QD so that the light output efficiency can be enhanced.

Furthermore, the light emitting device in accordance with an embodiment of the present disclosure may dispose the color conversion layer CCL including the red quantum dots QD on the same substrate SUB as that of the light emitting elements LD so that the distance between the light emitting elements LD and the color conversion layer CCL may be reduced or minimized. Hence, the blue light emitted from the light emitting elements LD may be directly incident on the color conversion layer CCL without light loss so that the quantity of light eventually emitted from the color conversion layer CCL can be increased. Consequently, the light output efficiency of the light emitting device may be enhanced.

If the color conversion layer CCL is not disposed on the substrate SUB (hereinafter, referred to as 'first substrate') on which the light emitting elements LD are provided but is disposed on a separate substrate (hereinafter, referred to as 'second substrate') facing the first substrate SUB, the distance between the light emitting elements LD provided on the first substrate SUB and the color conversion layer CCL provided on the second substrate may be increased. In this case, the blue light emitted from the light emitting elements LD may be incident not only on the color conversion layer CCL provided in the sub-pixel SP but also on color conversion layers provided in sub-pixels adjacent to the sub-pixel SP. In this case, color mixture may be caused between the color conversion layer CCL provided in the sub-pixel SP and the color conversion layers provided in the sub-pixels adjacent to the sub-pixel SP.

Furthermore, during a process of bonding the first substrate SUB and the second substrate, the light emitting elements LD of the first substrate SUB may be misaligned from the color conversion layer CCL of the second substrate. In this case, color mixture may also be caused between the color conversion layer CCL provided in the sub-pixel SP and the color conversion layers provided in the sub-pixels adjacent to the sub-pixel SP.

Given this, in the light emitting device in accordance with an embodiment of the present disclosure, the color conversion layer CCL and the light emitting elements LD may be disposed on the same first substrate SUB to prevent the color mixture between the sub-pixel SP and the sub-pixels adjacent thereto and prevent the misalignment.

Furthermore, in the light emitting device in accordance with an embodiment of the present disclosure, the color conversion layer CCL and the light emitting elements LD may be disposed on the same first substrate SUB so that a process of forming the color conversion layer CCL on the second substrate may be skipped. Therefore, the process of fabricating the light emitting device in accordance with an embodiment of the present disclosure may be simplified.

Figure 3B:
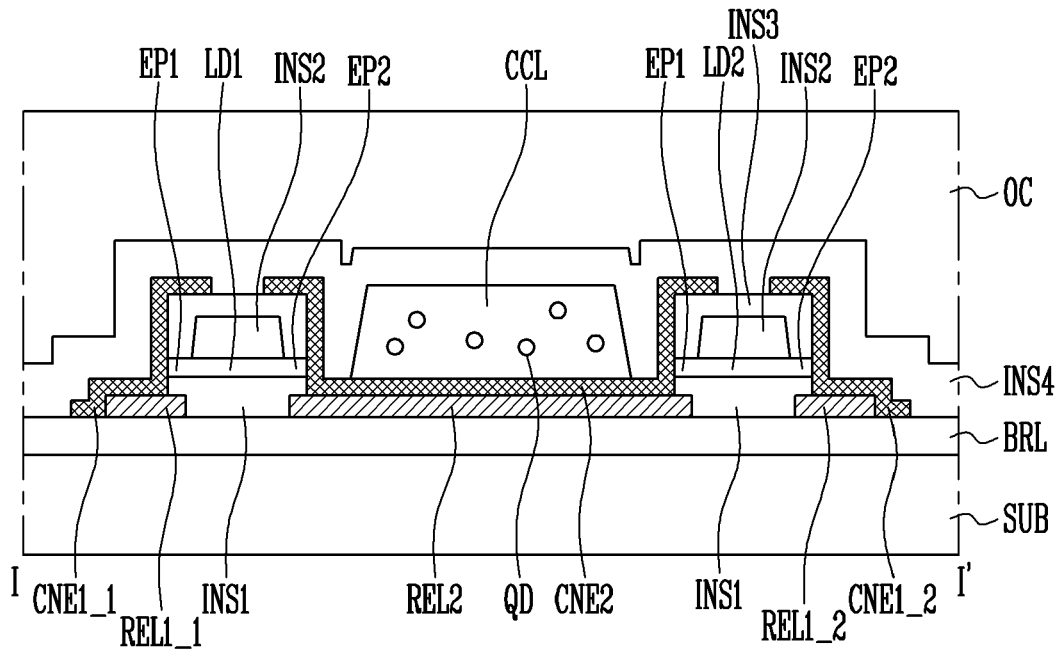
FIGS. 3B and 3C illustrate a light emitting device in accordance with an embodiment of the present disclosure, and is a sectional diagram corresponding to the line I-I' of FIG. 2.

FIG. 3B illustrates a light emitting device in accordance with an embodiment of the present disclosure, and is a sectional diagram corresponding to the line I-I' of FIG. 2.

The light emitting device illustrated in FIG. 3B, other than the fact that a color conversion layer is disposed on a second contact electrode, may have a configuration that is substantially the same or similar to that of the light emitting device of FIGS. 2 and 3A.

Therefore, to avoid redundant explanation, the description of the light emitting device of FIG. 3B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 2, and 3B, the light emitting device in accordance with an embodiment of the present disclosure may include a substrate SUB on which at least one sub-pixel SP having a unit emission area 100 is provided, and a plurality of light emitting elements LD provided on the substrate SUB.

In an embodiment of the present disclosure, the plurality of light emitting elements LD each may be a light emitting diode fabricated to have a subminiature size and emit blue light having a relatively short wavelength in a visible ray area.

First and second connection lines CNL1 and CNL2, first and second electrodes REL1 and REL2, first and second contact electrodes CNE1 and CNE2, and a color conversion layer CCL may be provided in the unit emission area 100 of the sub-pixel SP.

The first and second electrodes REL1 and REL2 may be provided at the same plane and spaced from each other (e.g., spaced from each other by a predetermined distance).

The first and second contact electrode CNE1 and CNE2 may be provided on corresponding one of the first and second electrodes REL1 and REL2 and may be electrically and/or physically coupled to the corresponding one of the first and second electrodes REL1 and REL2. For example, the first contact electrode CNE1 may be provided on the first electrode REL1 and may be electrically and/or physically coupled with the first electrode REL1. The second contact electrode CNE2 may be provided on the second electrode REL2 and may be electrically and/or physically coupled with the second electrode REL2.

Although as illustrated in FIG. 3B the first and second contact electrodes CNE1 and CNE2 are provided at the same plane and are spaced from each other (e.g., spaced from each other by a predetermined distance), the present disclosure is not limited thereto. In an embodiment, the first and second contact electrodes CNE1 and CNE2 may be provided on different layers. Detailed description of an embodiment where the first and second contact electrodes CNE1 and CNE2 are provided on different layers will be made with reference to FIG. 3C.

The color conversion layer CCL may convert the blue light into specific color light to be eventually emitted from the sub-pixel SP. For example, in the case where the sub-pixel SP is a red sub-pixel, the color conversion layer CCL may convert the blue light into red light and emit the red light. To this end, the color conversion layer CCL may include red quantum dots QD. The red quantum dots QD may be provided in the color conversion layer CCL in the form in which the red quantum dots QD are distributed in transparent resin.

The color conversion layer CCL may be provided on the second contact electrode CNE2 in the unit emission area 100 of the sub-pixel SP and overlap with the second electrode REL2 and the second contact electrode CNE2.

The color conversion layer CCL may be formed on the second contact electrode CNE2 by an exposure method or the like after the first and second contact electrodes CNE1 and CNE2 are formed on the substrate SUB.

The red light that is eventually emitted from the color conversion layer CCL may be reflected in the frontal direction of the light emitting device by the first and second electrodes REL1 and REL2 disposed under the color conversion layer CCL.

A fourth insulating layer INS4 may be provided on the color conversion layer CCL. The fourth insulating layer INS4 may prevent the first and second contact electrodes CNE1 and CNE2 and the color conversion layer CCL from being exposed to the outside, thus protecting the first and second contact electrodes CNE1 and CNE2 and the color conversion layer CCL. The fourth insulating layer INS4 may be formed of inorganic insulating layer such as silicon nitride $SiN_x$ to prevent oxygen, water, or the like from being drawn into the light emitting elements LD and the color conversion layer CCL from the outside.

As described above, in the light emitting device in accordance with an embodiment of the present disclosure, the color conversion layer CCL may be disposed on the same substrate SUB as that of the light emitting elements LD so that the efficiency of light to be eventually emitted from the sub-pixel SP can be enhanced.

Figure 3C:
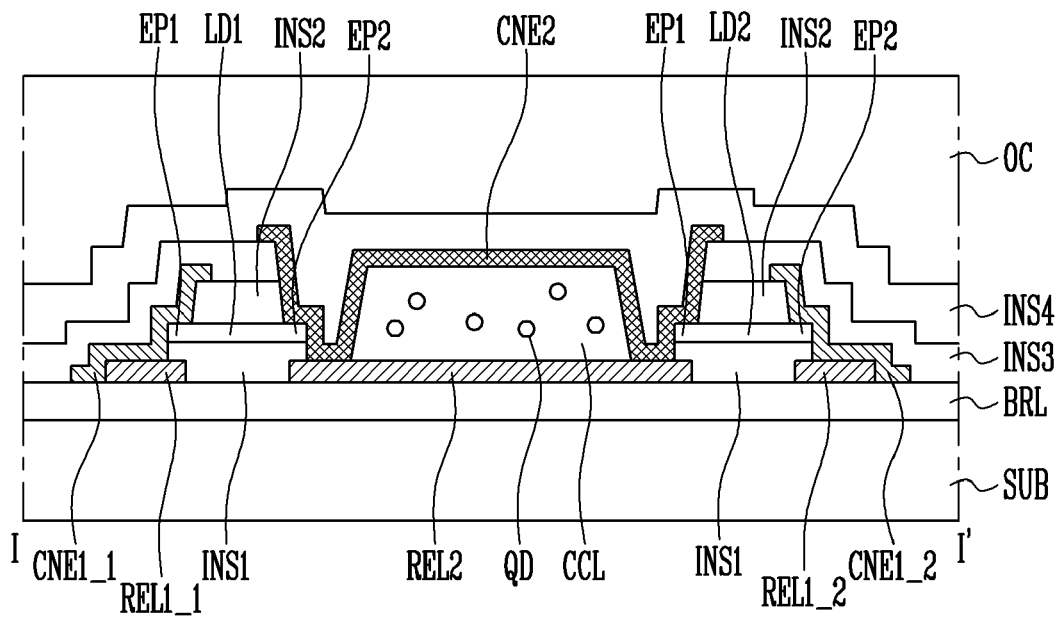

FIG. 3C illustrates a light emitting device in accordance with an embodiment of the present disclosure, and is a sectional diagram corresponding to the line I-I' of FIG. 2.

The light emitting device illustrated in FIG. 3C, other than the fact that first and second contact electrodes are disposed on different layers, may have a configuration that is substantially the same or similar to that of the light emitting device of FIGS. 2 and 3A.

Therefore, to avoid redundant explanation, the description of the light emitting device of FIG. 3C will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 2, and 3C, the light emitting device in accordance with an embodiment of the present disclosure may include a substrate SUB on which at least one sub-pixel SP having a unit emission area 100 is provided, and a plurality of light emitting elements LD (e.g., LD1, LD2) provided on the substrate SUB.

In an embodiment of the present disclosure, each of the plurality of light emitting elements LD may be a light emitting diode fabricated to have a subminiature size and may emit blue light having a relatively short wavelength in a visible ray area.

First and second connection lines CNL1 and CNL2, first and second electrodes REL1 and REL2, first and second contact electrodes CNE1 and CNE2, and a color conversion layer CCL may be provided in the unit emission area 100 of the sub-pixel SP.

The first and second electrodes REL1 and REL2 may be provided at the same plane and may be spaced from each other (e.g., spaced from each other by a predetermined distance).

The first contact electrode CNE1 may be provided on the first electrode REL1 and one of the opposite ends EP1 and EP2 of each of the light emitting elements LD.

A third insulating layer INS3 may be provided on the first contact electrode CNE1. The third insulating layer INS3 may prevent the first contact electrode CNE1 from being exposed to the outside, thus preventing the first contact electrode CNE1 from being corroded.

The color conversion layer CCL may be formed on the second electrode REL2 by an exposure method or the like on the substrate SUB on which the first contact electrode CNE1 is provided. In a plan view, the color conversion layer CCL may overlap with the second electrode REL2.

The color conversion layer CCL may include red quantum dots QD for converting blue light emitted from the light emitting elements LD into red light. The red light that is eventually emitted from the color conversion layer CCL may be reflected in the frontal direction of the light emitting device by the first and second electrodes REL1 and REL2 disposed under the color conversion layer CCL.

The second contact electrode CNE2 may be provided on the color conversion layer CCL. The second contact electrode CNE2 may also be provided on the second electrode REL2 and the other one of the opposite ends EP1 and EP2 of each of the light emitting elements LD and the third insulating layer INS3.

In a sectional view, the second contact electrode CNE2 may overlap with the second electrode REL2 on opposite ends of the color conversion layer CCL with the color conversion layer CCL interposed therebetween. The second contact electrode CNE2 may be provided on a layer different from that of the first contact electrode CNE1.

A fourth insulating layer INS4 may be provided on the second contact electrode CNE2. An overcoat layer OC may be provided on the fourth insulating layer INS4.

As described above, in the light emitting device in accordance with an embodiment of the present disclosure, the color conversion layer CCL may be disposed on the same substrate SUB as that of the light emitting elements LD so that the efficiency of light to be eventually emitted from the sub-pixel SP can be enhanced.

Figure 4:
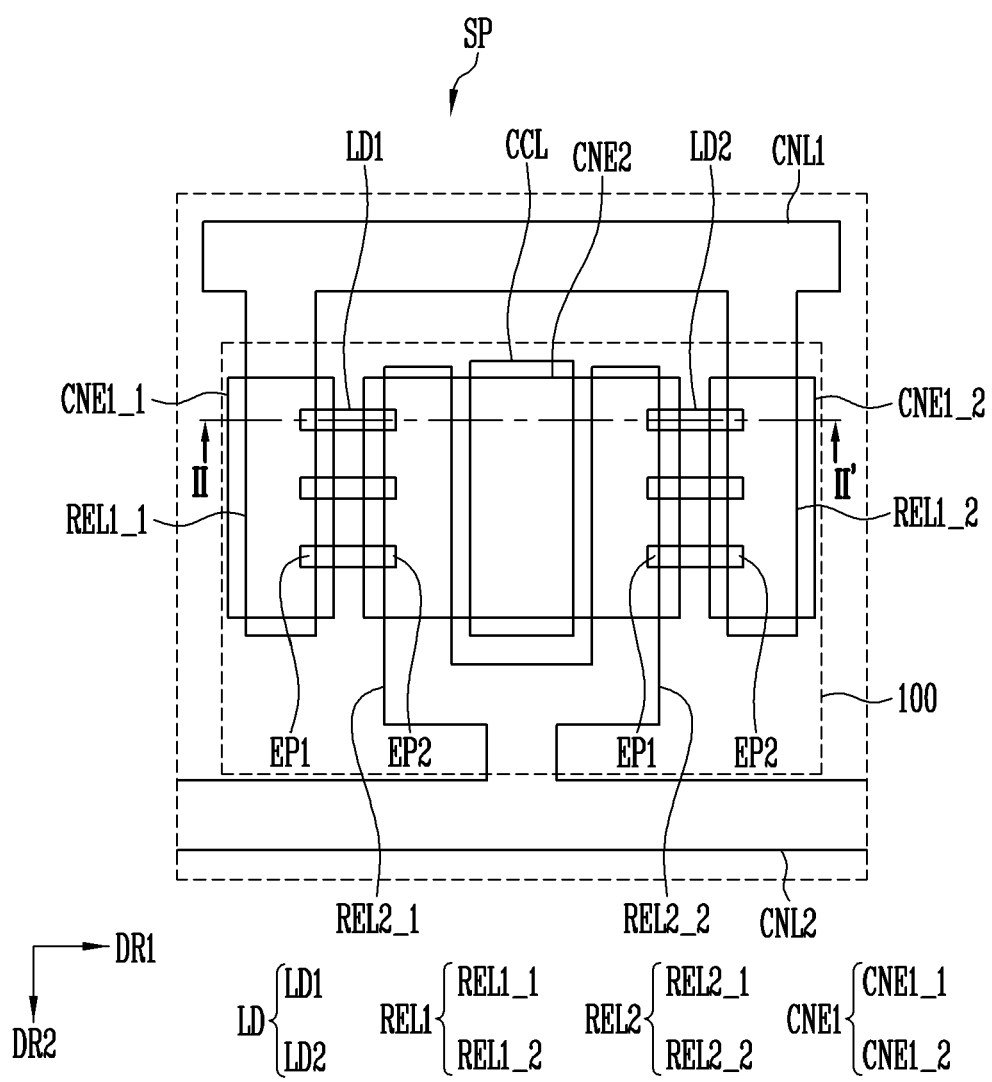
FIG. 4 is a plan diagram illustrating a unit emission area of a light emitting device in accordance with an embodiment of the present disclosure.
Figure 5:
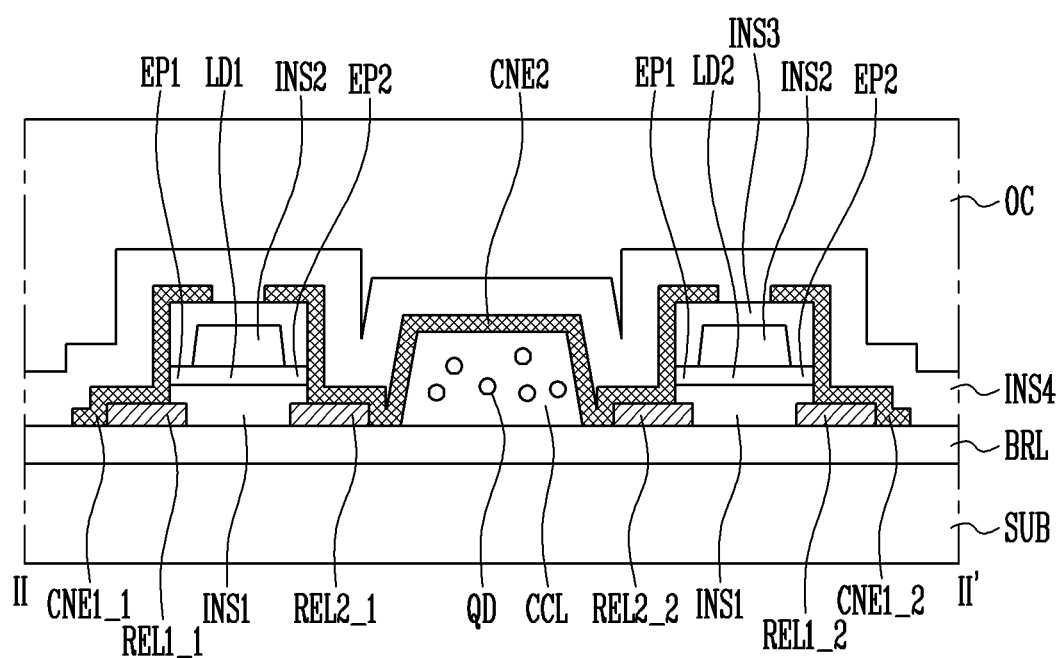
FIG. 5 is a sectional diagram taken along the line II-II' of FIG. 4.

FIG. 4 is a plan diagram illustrating a unit emission area of a light emitting device in accordance with an embodiment of the present disclosure. FIG. 5 is a sectional diagram taken along the line II-II' of FIG. 4.

The light emitting device illustrated in FIGS. 4 and 5, other than the fact that a second electrode includes a 2-1-th electrode REL2_1 and a 2-2-th electrode REL2_2 which diverge from a second connection line CNL2, may have a configuration substantially same or similar to that of the light emitting device of FIGS. 2 and 3A.

Therefore, to avoid redundant explanation, the description of the light emitting device of FIGS. 4 and 5 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 4, and 5, the light emitting device in accordance with an embodiment of the present disclosure may include a substrate SUB on which at least one sub-pixel SP having a unit emission area 100 is provided, and a plurality of light emitting elements LD provided on the substrate SUB.

In an embodiment of the present disclosure, the plurality of light emitting elements LD each may be a light emitting diode fabricated to have a subminiature size and emit blue light having a relatively short wavelength in a visible ray area.

First and second connection lines CNL1 and CNL2, first and second electrodes REL1 and REL2, first and second contact electrodes CNE1 and CNE2, and a color conversion layer CCL may be provided in the unit emission area 100 of the sub-pixel SP.

The first connection line CNL1 may extend in the first direction DR1 and be provided only in the sub-pixel SP so that the sub-pixel SP may be electrically separated from sub-pixels adjacent thereto.

The second connection line CNL2 may extend in a direction parallel to a direction in which the first connection line CNL1 extends. The second connection line CNL2 may extend not only to the sub-pixel SP but also to the sub-pixels adjacent to the sub-pixel SP.

The first electrode REL1 may include a 1-1-th electrode REL1_1 and a 1-2-th electrode REL1_2 which diverge from the first connection line CNL1 in a second direction DR2 intersecting with (or crossing) the first direction DR1. The 1-1-th electrode REL1_1, the 1-2-th electrode REL1_2, and the first connection line CNL1 may be integrally provided and electrically and/or physically coupled to each other.

The second electrode REL2 may include a 2-1-th electrode REL2_1 and a 2-2-th electrode REL2_2 which diverge from the second connection line CNL2 in the second direction DR2. The 2-1-th electrode REL2_1, the 2-2-th electrode REL2_2, and the second connection line CNL2 may be integrally provided and electrically and/or physically coupled to each other.

The 1-1-th electrode REL1_1 and the 2-1-th electrode REL2_1 may be provided on the substrate SUB at positions spaced from each other (e.g., spaced from each other by a predetermined distance) with the first light emitting elements LD1 of the light emitting elements LD interposed therebetween.

The 1-1-th electrode REL1_1 may be electrically coupled to one of the opposite ends EP1 and EP2 of each of the first light emitting elements LD1 through the first contact electrode CNE1 (e.g., 1-1th contact electrode CNE1_1). The 2-1-th electrode REL2_1 may be electrically coupled to the other end of each of the first light emitting elements LD1 through the second contact electrode CNE2.

The 1-2-th electrode REL1_2 may be electrically coupled to one of the opposite ends EP1 and EP2 of each of the second light emitting elements LD2 through the first contact electrode CNE1 (e.g., 1-2th contact electrode CNE1_2). The 2-2-th electrode REL2_2 may be electrically coupled to the other end of each of the second light emitting elements LD2 through the second contact electrode CNE2.

The first and second electrodes REL1 and REL2 may be formed of conductive material having a reflectivity (e.g., predetermined reflectivity) so that light emitted from the color conversion layer CCL can travel in a direction in which an image of the light emitting device is displayed.

The color conversion layer CCL may convert the blue light emitted from each of the light emitting elements LD into light having a specific color, and then emit the light. The color conversion layer CCL may include red quantum dots QD that are photoconversion particles for converting the blue light into red light.

In an embodiment of the present disclosure, the color conversion layer CCL may be provided on the substrate SUB between the first light emitting elements LD1 and the second light emitting elements LD2 in the unit emission area 100 of the sub-pixel SP.

In an plan view, the color conversion layer CCL may be provided on the substrate SUB between the 2-1-th electrode REL2_1 and the 2-2-th electrode REL2_2 and may overlap with the second contact electrode CNE2. The second contact electrode CNE2 may be provided on the color conversion layer CCL, but the present disclosure is not limited thereto. In an embodiment, the second contact electrode CNE2 may be disposed under the color conversion layer CCL.

The color conversion layer CCL may be formed and/or provided between the 2-1-th and 2-2-th electrodes REL2_1 and REL2_2 by an exposure method or the like before the first and second contact electrodes CNE1 and CNE2 are formed in the unit emission area 100 of the sub-pixel SP.

As described above, if voltages (e.g., predetermined voltages) are applied to the opposite ends EP1 and EP2 of each of the first and second light emitting elements LD1 and LD2 through the first and second electrodes REL1 and REL2, each of the first and second light emitting elements LD1 and LD2 may emit the blue light. The blue light emitted from each of the first and second light emitting elements LD1 and LD2 may travel to the color conversion layer CCL.

If the blue light is drawn into the color conversion layer CCL, the red quantum dots QD may be excited so that the blue light can be absorbed and the red light can be emitted. The red light emitted from the red quantum dots QD may be emitted in all directions.

The red light that is eventually emitted from the color conversion layer CCL may be reflected in the frontal direction of the light emitting device by the first and second electrodes REL1 and REL2 disposed under the color conversion layer CCL.

As described above, in the light emitting device in accordance with an embodiment of the present disclosure, the color conversion layer CCL may be disposed on the same substrate SUB as that of the light emitting elements LD so that the efficiency of light to be eventually emitted from the sub-pixel SP may be enhanced.

Figure 6:
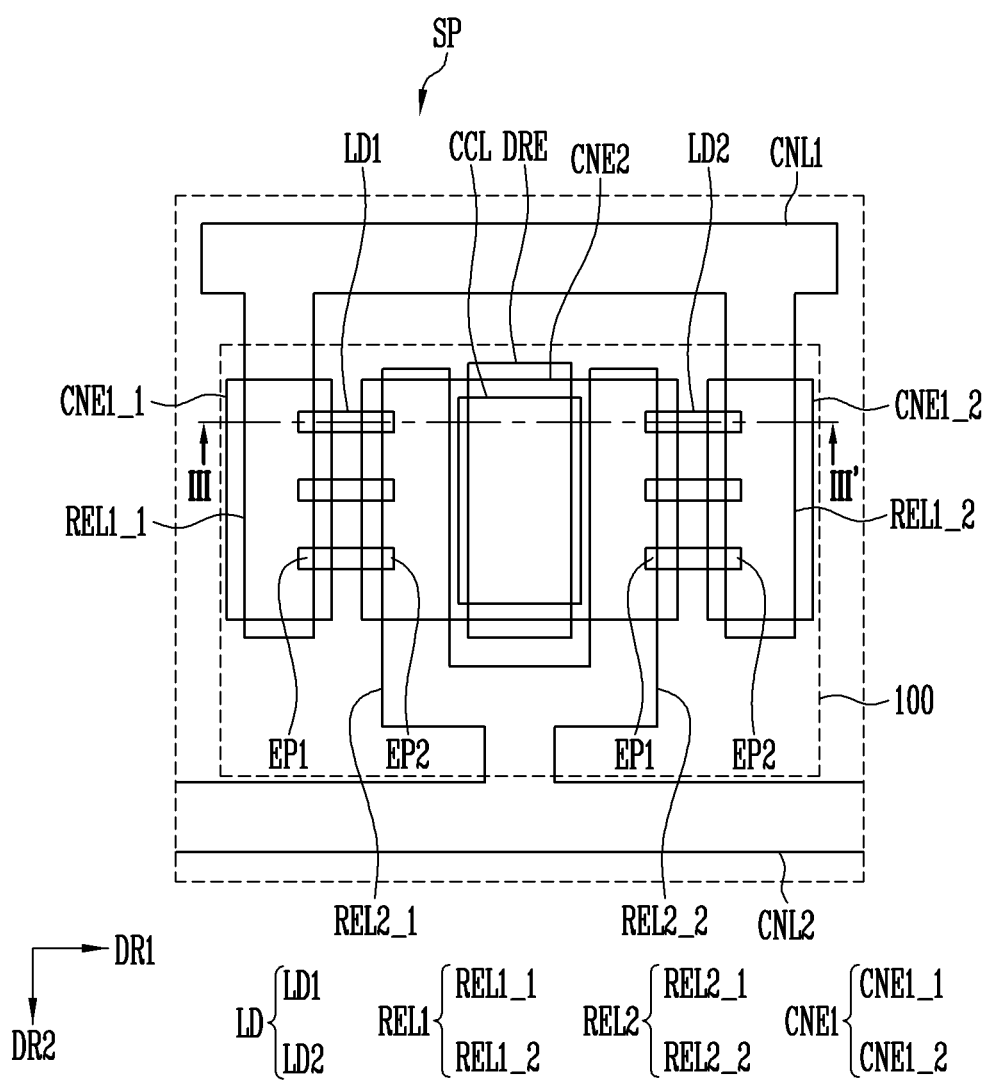
FIG. 6 is a plan diagram illustrating a unit emission area of a light emitting device in accordance with an embodiment of the present disclosure.
Figure 7:
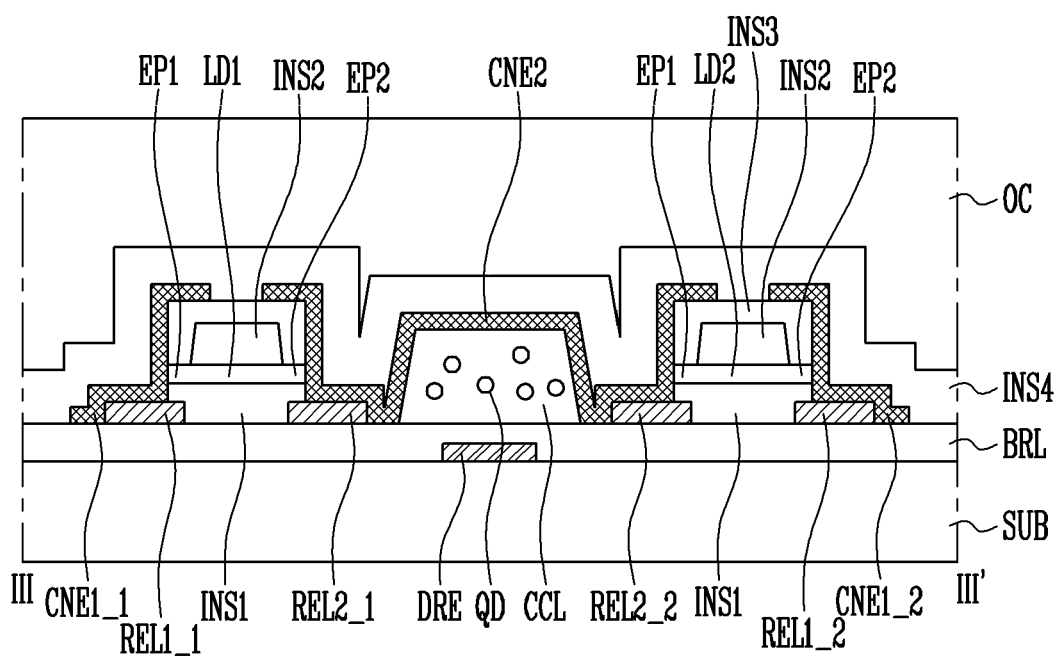
FIG. 7 is a sectional diagram taken along the line III-III' of FIG. 6.

FIG. 6 is a plan diagram illustrating a unit emission area of a light emitting device in accordance with an embodiment of the present disclosure. FIG. 7 is a sectional diagram taken along the line III-III' of FIG. 6.

The light emitting device illustrated in FIGS. 6 and 7, other than the fact that a dummy electrode is disposed between a substrate and a color conversion layer, may have a configuration that is substantially the same or similar to that of the light emitting device of FIGS. 4 and 5.

Therefore, to avoid redundant explanation, the description of the light emitting device of FIGS. 6 and 7 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 6, and 7, the light emitting device in accordance with an embodiment of the present disclosure may include a substrate SUB on which at least one sub-pixel SP having a unit emission area 100 is provided, and a plurality of light emitting elements LD provided on the substrate SUB.

In an embodiment of the present disclosure, each of the plurality of light emitting elements LD (e.g., LD1, LD2) may be a light emitting diode fabricated to have a subminiature size and may emit blue light having a relatively short wavelength in a visible ray area.

First and second connection lines CNL1 and CNL2, first and second electrodes REL1 and REL2, first and second contact electrodes CNE1 and CNE2, a color conversion layer CCL, and a dummy electrode DRE may be provided in the unit emission area 100 of the sub-pixel SP.

The first and second electrodes REL1 and REL2 may be provided at the same plane and may be spaced from each other (e.g., spaced from each other by a predetermined distance).

The first and second contact electrodes CNE1 and CNE2 may be provided on a third insulating layer INS3 and may be spaced from each other (e.g., spaced from each other by a predetermined distance) to be electrically separated from each other.

The color conversion layer CCL may include red quantum dots QD for converting the blue light emitted from each of the light emitting elements LD into red light.

The color conversion layer CCL may be provided on the substrate SUB between the first light emitting elements LD1 of the light emitting elements LD and the second light emitting elements LD2 of the light emitting elements LD in the unit emission area 100 of the sub-pixel SP.

In an plan view, the color conversion layer CCL may be provided on the substrate SUB between the 2-1-th electrode REL2_1 and the 2-2-th electrode REL2_2 and may overlap with the second contact electrode CNE2. The second contact electrode CNE2 may be provided on the color conversion layer CCL, but the present disclosure is not limited thereto. In an embodiment, the second contact electrode CNE2 may be disposed under the color conversion layer CCL.

The dummy electrode DRE may be provided between the color conversion layer CCL and the substrate SUB. The dummy electrode DRE may be a dummy reflective component configured to reflect the red light emitted from the color conversion layer CCL and traveling downward from the color conversion layer CCL, in a direction in which an image of the light emitting device is displayed. To this end, the dummy electrode DRE may be formed of conductive material having a reflectivity (e.g., predetermined reflectivity).

The conductive material may include, for example, metal such as Ag, Mg, Al, Pt, Pd, Au, Ni, Nd, Ir, Cr, or an alloy of them, a conductive oxide such as an indium tin oxide (ITO), an indium zinc oxide (IZO), a zinc oxide (ZnO), or an indium tin zinc oxide (ITZO), and a conductive polymer such as PEDOT.

The first and second electrodes REL1 and REL2 may include the same material as that of the dummy electrode DRE, but the present disclosure is not limited thereto.

In the light emitting device, the dummy electrode DRE is disposed under the color conversion layer CCL so that the red light traveling downward from the color conversion layer CCL can also be reflected in a direction in which the image is displayed, whereby the efficiency of light to be eventually emitted from the sub-pixel SP may be further enhanced.

Figure 8:
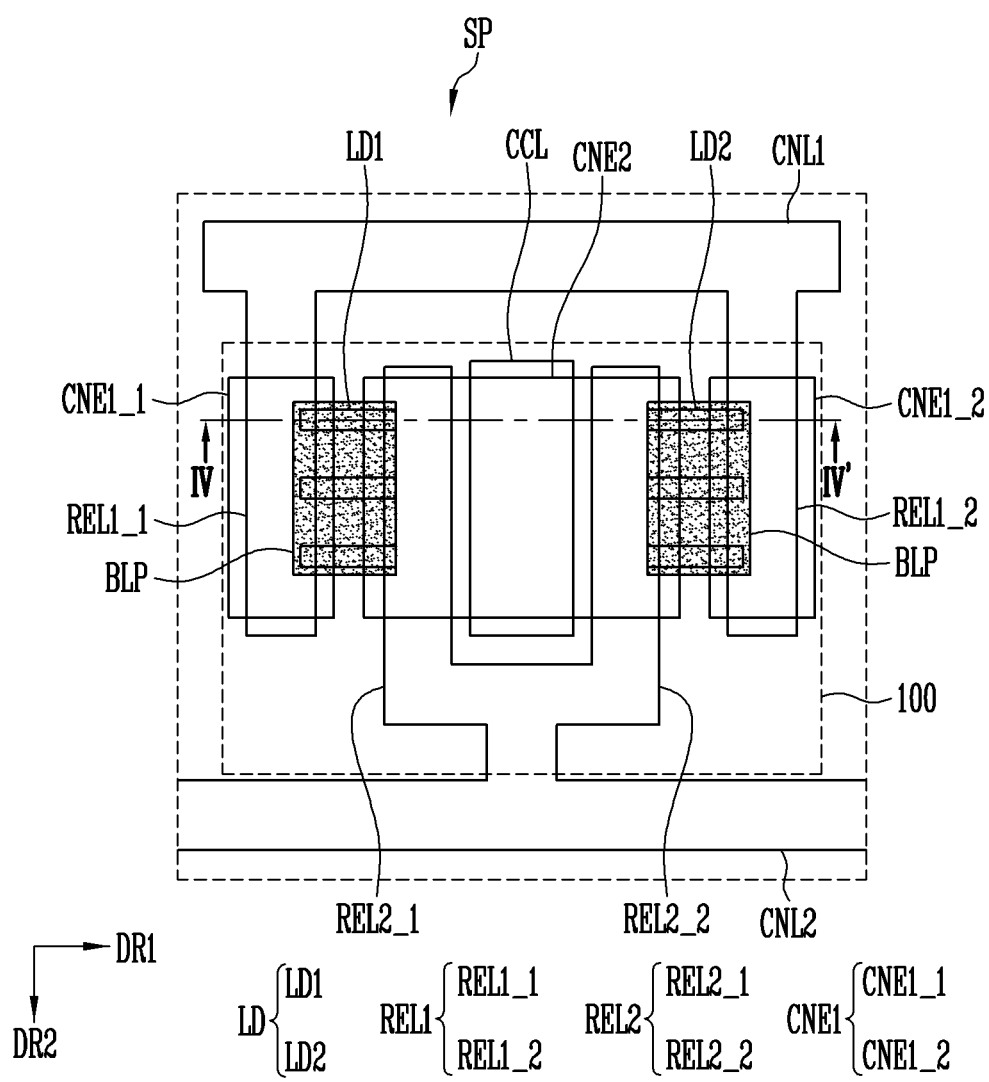
FIG. 8 is a plan diagram illustrating a unit emission area of a light emitting device in accordance with an embodiment of the present disclosure.
Figure 9:
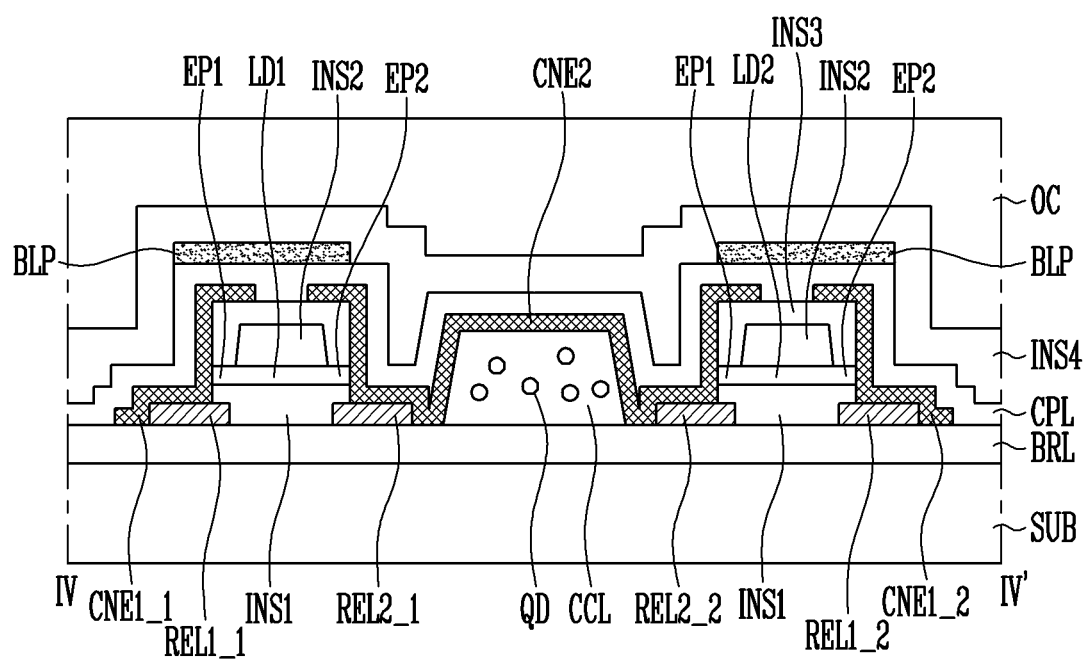
FIG. 9 is a sectional diagram taken along the line IV-IV' of FIG. 8.

FIG. 8 is a plan diagram illustrating a unit emission area of a light emitting device in accordance with an embodiment of the present disclosure. FIG. 9 is a sectional diagram taken along the line IV-IV' of FIG. 8.

The light emitting device illustrated in FIGS. 8 and 9, other than the fact that a capping insulating layer CPL is disposed on first and second contact electrodes CNE1 and CNE2 and a light block pattern is disposed on a fourth insulating layer, may have a configuration that is substantially the same or similar to that of the light emitting device of FIGS. 4 and 5.

Therefore, to avoid redundant explanation, the description of the light emitting device of FIGS. 8 and 9 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 8, and 9, the light emitting device in accordance with an embodiment of the present disclosure may include a substrate SUB on which at least one sub-pixel SP having a unit emission area 100 is provided, and a plurality of light emitting elements LD provided on the substrate SUB.

In an embodiment of the present disclosure, the plurality of light emitting elements LD each may be a light emitting diode fabricated to have a subminiature size and emit blue light having a relatively short wavelength in a visible ray area.

First and second connection lines CNL1 and CNL2, first and second electrodes REL1 and REL2, first and second contact electrodes CNE1 and CNE2, a color conversion layer CCL, and a light block pattern BLP may be provided in the unit emission area 100 of the sub-pixel SP.

The first and second electrodes REL1 and REL2 may be provided at the same plane and may be spaced form each other (e.g., spaced from each other by a predetermined distance).

The first electrode REL1 may include 1-1-th and 1-2-th electrodes REL1_1 and REL1_2 that are provided on the substrate SUB at positions spaced form each other (e.g., spaced from each other by a predetermined distance) and thus are electrically and/or physically separated from each other. The second electrode REL2 may include 2-1-th and 2-2-th electrodes REL2_1 and REL2_2 that are provided on the substrate SUB at positions spaced form each other (e.g., spaced from each other by a predetermined distance) but are electrically and/or physically coupled to each other.

The color conversion layer CCL may be provided on the substrate SUB between the 2-1-th electrode REL2_1 and the 2-2-th electrode REL2_2. The color conversion layer CCL may include red quantum dots QD for converting the blue light emitted from each of the light emitting elements LD into red light.

The first and second contact electrodes CNE1 and CNE2 may be provided at the same plane and spaced form each other (e.g., spaced from each other by a predetermined distance). In detail, the first and second contact electrodes CNE1 and CNE2 may be provided on a third insulating layer INS3 and may be spaced from each other by a predetermined distance to be electrically separated from each other.

The second contact electrode CNE2 may be provided on the color conversion layer CCL and may overlap with the color conversion layer CCL. Furthermore, the second contact electrode CNE2 may be provided on the 2-1-th and 2-2-th electrodes REL2_1 and REL2_2 and may overlap with the 2-1-th and 2-2-th electrodes REL2_1 and REL2_2.

A capping insulating layer CPL may be provided on the first and second contact electrodes CNE1 and CNE2. The capping insulating layer CPL may prevent the color conversion layer CCL and the first and second contact electrodes CNE1 and CNE2 from being exposed to the outside, thus protecting the first and second contact electrodes CNE1 and CNE2 and the color conversion layer CCL. For example, the capping insulating layer CPL may include an inorganic insulating layer formed of inorganic material to prevent oxygen, water, or the like from being drawn into the light emitting elements LD and the color conversion layer CCL from the outside.

The light block pattern BLP may be provided on the capping insulating layer CPL.

The light block pattern BLP may be provided on the capping insulating layer CPL to correspond to the upper surfaces of the light emitting elements LD.

The light block pattern BLP may absorb the blue light traveling toward the upper surfaces of the light emitting elements LD from among light rays emitted from the light emitting elements LD, thus preventing the color purity of the light emitting device from being degraded. To this end, the light block pattern BLP may include material capable of absorbing the blue light that travels toward the upper surfaces of the light emitting elements LD. For example, the light block pattern BLP may include a black matrix, but the present disclosure is not limited thereto.

Furthermore, the light block pattern BLP may reduce reflection of external light by absorbing light that is incident on the light emitting device from the outside.

A fourth insulating layer INS4 may be provided on the light block pattern BLP. An overcoat layer OC may be provided on the fourth insulating layer INS4.

As described above, in the light emitting device in accordance with an embodiment of the present disclosure, the color conversion layer CCL may be disposed on the same substrate SUB as that of the light emitting elements LD, and the light block pattern BLP may be disposed on the upper surfaces of the light emitting elements LD, so that the efficiency of light to be eventually emitted from the sub-pixel SP can be enhanced and the color purity of the sub-pixel SP can be prevented from being degraded.

Figure 10:
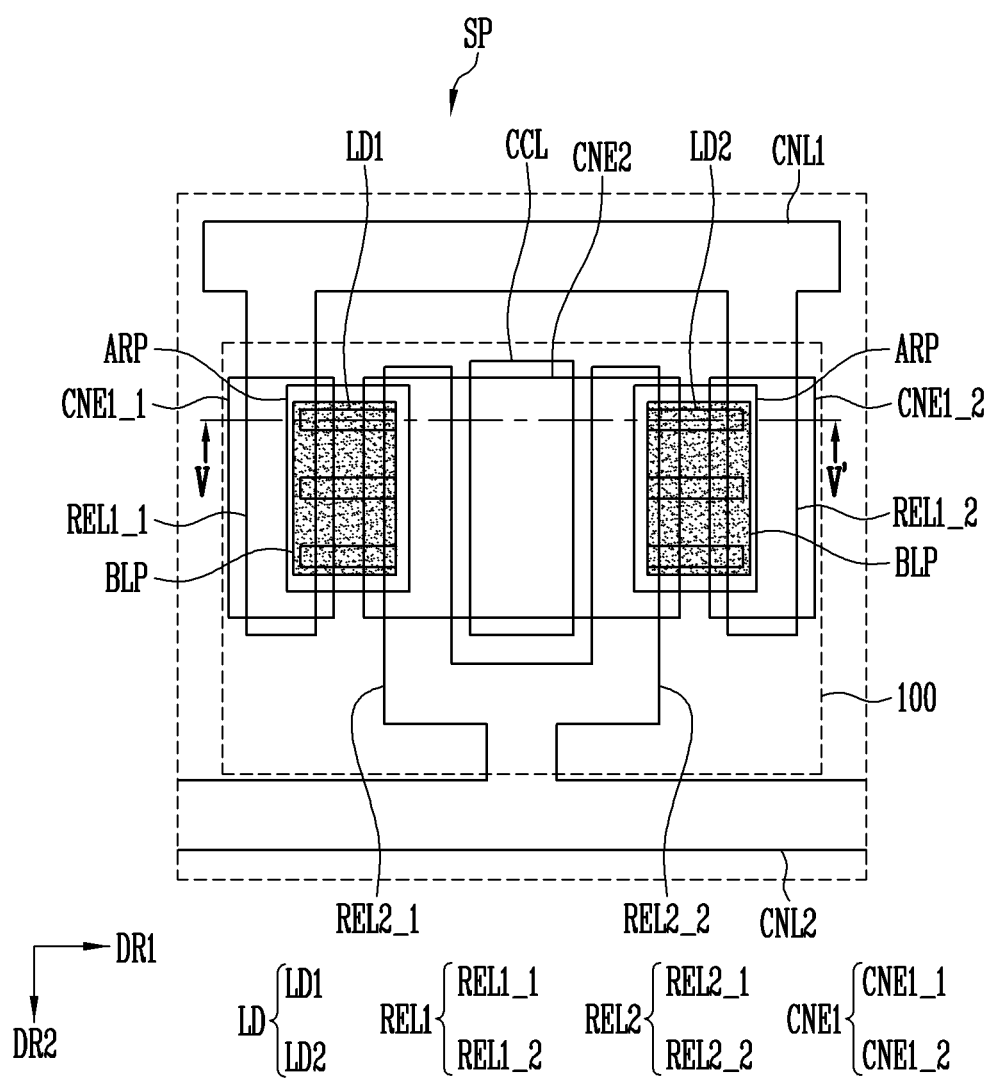
FIG. 10 is a plan diagram illustrating a unit emission area of a light emitting device in accordance with an embodiment of the present disclosure.
Figure 11:
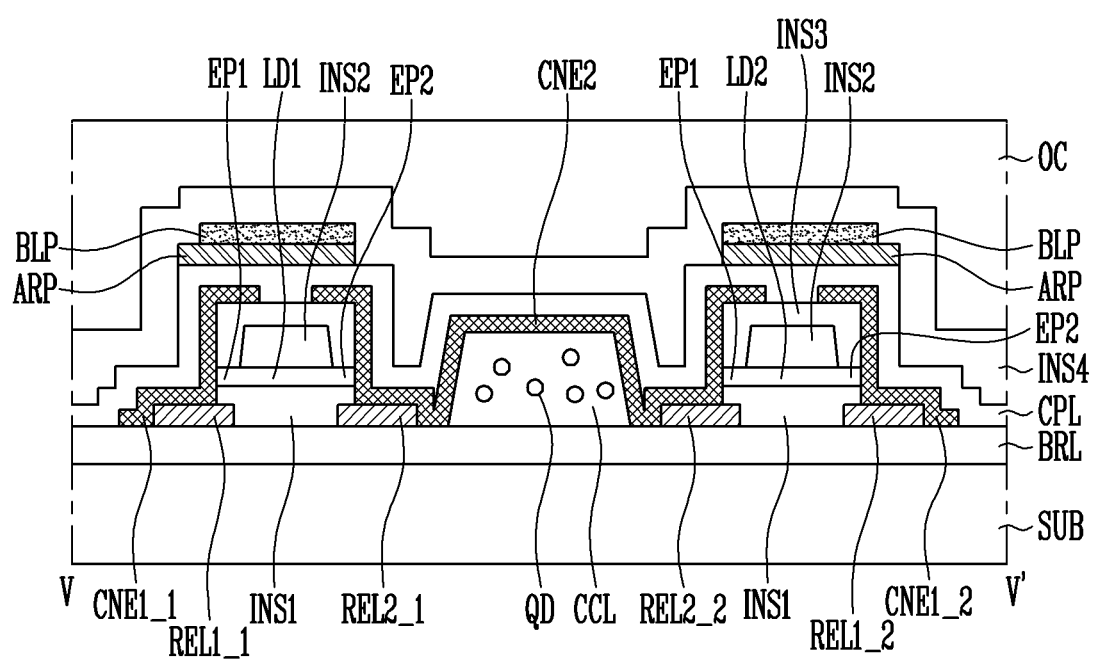
FIG. 11 is a sectional diagram taken along the line V-V' of FIG. 10.

FIG. 10 is plan diagram illustrating a unit emission area of a light emitting device in accordance with an embodiment of the present disclosure. FIG. 11 is a sectional diagram taken along the line V-V' of FIG. 10.

The light emitting device illustrated in FIGS. 10 and 11, other than the fact that an auxiliary pattern is disposed between a light block pattern BLP and a capping insulating layer CPL, may have a configuration that is substantially the same or similar to that of the light emitting device of FIGS. 8 and 9.

Therefore, to avoid redundant explanation, the description of the light emitting device of FIGS. 10 and 11 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 10, and 11, the light emitting device in accordance with an embodiment of the present disclosure may include a substrate SUB on which at least one sub-pixel SP having a unit emission area 100 is provided, and a plurality of light emitting elements LD provided on the substrate SUB.

In an embodiment of the present disclosure, the plurality of light emitting elements LD each may be a light emitting diode fabricated to have a subminiature size and may emit blue light having a relatively short wavelength in a visible ray area.

First and second connection lines CNL1 and CNL2, first and second electrodes REL1 and REL2, first and second contact electrodes CNE1 and CNE2, a color conversion layer CCL, a light block pattern BLP, and an auxiliary pattern ARP may be provided in the unit emission area 100 of the sub-pixel SP.

The first electrode REL1 may include 1-1-th and 1-2-th electrodes REL1_1 and REL1_2 that are provided on the substrate SUB at positions spaced form each other (e.g., spaced from each other by a predetermined distance) and thus electrically and/or physically separated from each other. The second electrode REL2 may include 2-1-th and 2-2-th electrodes REL2_1 and REL2_2 that are provided on the substrate SUB at positions spaced form each other (e.g., spaced from each other by a predetermined distance) but are electrically and/or physically coupled to each other.

The color conversion layer CCL may be provided on the substrate SUB between the 2-1-th electrode REL2_1 and the 2-2-th electrode REL2_2. The second contact electrode CNE2 may be provided on the color conversion layer CCL and may overlap with the color conversion layer CCL.

A capping insulating layer CPL may be provided on the first and second contact electrodes CNE1 and CNE2.

The auxiliary pattern ARP may be provided on the capping insulating layer CPL. The auxiliary pattern ARP may be provided on the capping insulating layer CPL to correspond to the upper surfaces of the light emitting elements LD.

The auxiliary pattern ARP may reflect, toward the color conversion layer CCL, the blue light that travels toward the upper surfaces of the light emitting elements LD and thus increase excitation light of quantum dots QD provided in the color conversion layer CCL. To this end, the auxiliary pattern ARP may be formed of conductive material having a reflectivity (e.g., predetermined reflectivity).

The auxiliary pattern ARP may include the same material as that of the first and second electrodes REL1 and REL2, but the present disclosure is not limited thereto.

The light block pattern BLP may be provided on the auxiliary pattern ARP. The light block pattern BLP may be formed of a black matrix, and may absorb the blue light rays that travels toward the upper surfaces of the light emitting elements LD rather than being reflected toward the color conversion layer CCL by the auxiliary pattern ARP, from among the blue light rays emitted from the light emitting elements LD, thus preventing the color purity of the light emitting device from being degraded.

Furthermore, the light block pattern BLP may absorb light rays that are incident on the light emitting device from the outside, and may absorb light rays reflected by the auxiliary pattern ARP in a direction in which an image of the light emitting device is displayed, from among the light rays that are incident on the light emitting device, thus reducing reflection of external light from the light emitting device.

As described above, in the light emitting device in accordance with an embodiment of the present disclosure, the color conversion layer CCL may be disposed on the same substrate SUB as that of the light emitting elements LD, and the auxiliary pattern ARP and the light block pattern BLP may be disposed on the upper surfaces of the light emitting elements LD, so that the efficiency of light to be eventually emitted from the sub-pixel SP may be enhanced and the color purity of the sub-pixel SP may be prevented from being degraded.

Figure 12:
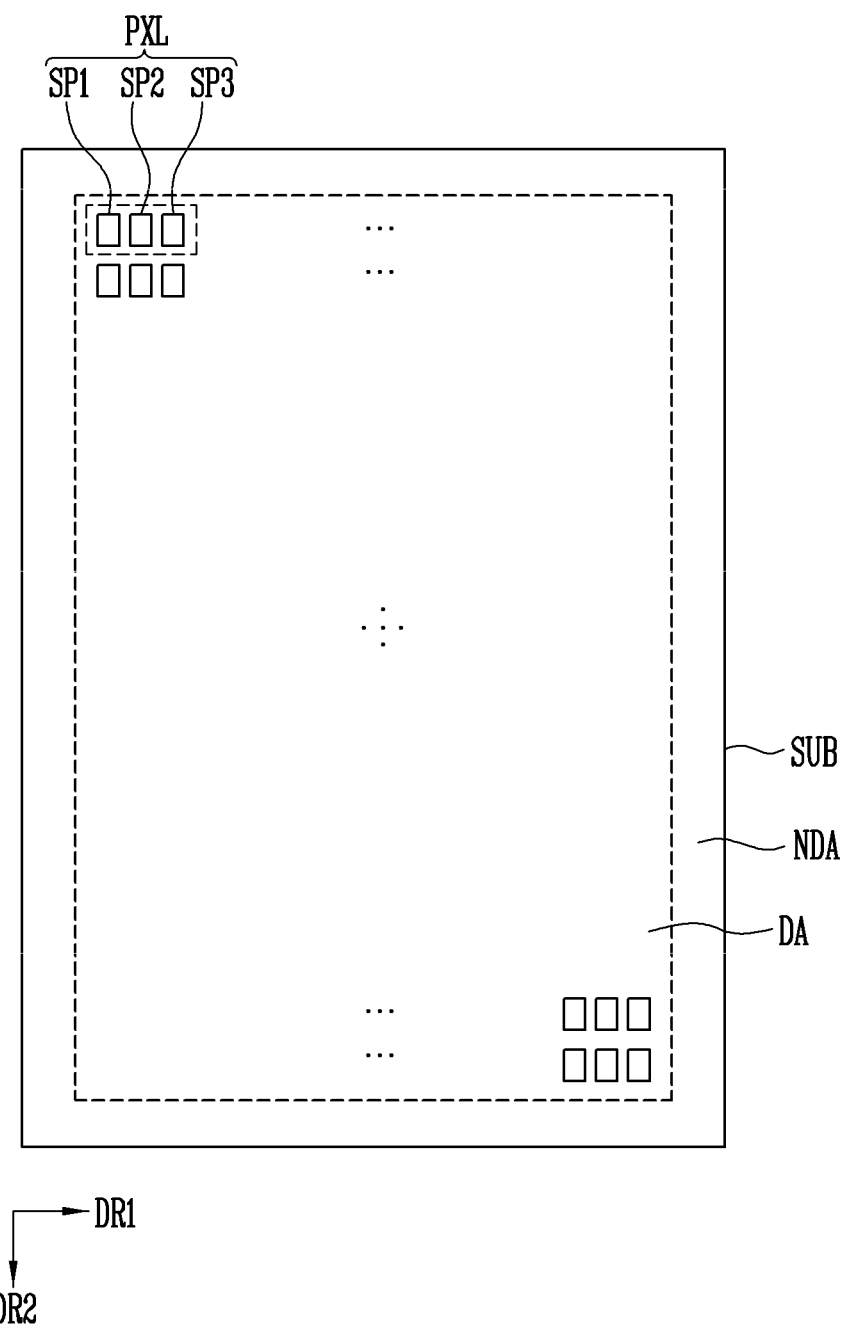
FIG. 12 illustrates a display device in accordance with an embodiment of the present disclosure, and particularly, is a schematic plan diagram illustrating a display device using the light emitting element illustrated in FIG. 1A as a light emitting source.

FIG. 12 illustrates a display device in accordance with an embodiment of the present disclosure, and for example, is a schematic plan diagram illustrating a display device using the light emitting element illustrated in FIG. 1A as a light emitting source.

For the sake of explanation, FIG. 12 schematically illustrates the structure of the display device, focused on a display area on which an image is displayed. In some embodiments, although not illustrated, at least one driving circuit (e.g., a scan driver and a data driver) and/or a plurality of lines may be further provided in the display device.

Referring to FIGS. 1A and 12, the display device in accordance with the embodiment of the present disclosure may include a substrate SUB, pixels PXL provided on the substrate SUB and each pixel PXL including at least one light emitting element LD. The display device may also include a driver (not illustrated) provided on the substrate SUB and configured to drive the pixels PXL, and a line component (not illustrated) provided to couple the pixels PXL with the driver.

The display device may be classified into a passive-matrix type display device and an active-matrix type display device according to a method of driving the light emitting element LD. For example, in the case where the display device is implemented as an active-matrix type, each of the pixels PXL may include a driving transistor configured to control the amount of current to be supplied to the light emitting element LD, and a switching transistor configured to transmit data signals to the driving transistor.

Recently, active-matrix type display devices capable of selectively turning on each pixel PXL, while taking into account the resolution, the contrast, and the working speed, have been developed. However, the present disclosure is not limited thereto. For example, passive-matrix type display devices in which pixels PXL may be turned on by groups may also employ components (e.g., first and second electrodes) for driving the light emitting element LD according to embodiments of the present disclosure.

The substrate SUB may include a display area DA and a non-display area NDA.

In an embodiment, the display area DA may be disposed in a central portion of the display device, and the non-display area NDA may be disposed in a perimeter portion of the display device in such a way as to enclose the display area DA. The locations of the display area DA and the non-display area NDA are not limited to this, and the locations thereof may be changed.

The display area DA may be an area in which the pixels PXL for displaying an image are provided. The non-display area NDA may be an area in which the driver for driving the pixels PXL and some of the line component for coupling the pixels PXL to the driver are provided.

The display area DA may have various shapes. For example, the display area DA may be provided in various forms such as a closed polygon including sides formed of linear lines, a circle, an ellipse or the like including a side formed of a curved line, and a semicircle, a semi-ellipse or the like including sides formed of a linear line and a curved line.

The non-display area NDA may be provided on at least one side of the display area DA. In an embodiment of the present disclosure, the non-display area NDA may enclose the periphery of the display area DA. For example, the non-display area NDA may surround the display area DA along the periphery of the display area DA.

The pixels PXL may be provided in the display area DA on the substrate SUB. Each of the pixels PXL refers to a smallest unit for displaying the image, and a plurality of pixels may be provided.

Each of the pixels PXL may include the light emitting element LD configured to be driven in response to a corresponding scan signal and a corresponding data signal. The light emitting element LD may have a small size corresponding to a nanoscale or a microscale, and be coupled in parallel to light emitting elements disposed adjacent thereto. The light emitting element LD may form a light source of the corresponding pixel PXL.

The pixels PXL may be arranged in a matrix form along rows extending in a first direction DR1 and columns extending in a second direction DR2 intersecting with (or crossing) the first direction DR1. However, the arrangement of the pixels PXL is not limited to a particular arrangement. In other words, the pixels PXL may be arranged in various forms.

The driver may provide a signal to each pixel PXL through the line component and thus may control the operation of the pixel PXL. In FIG. 12, for the sake of explanation, the line component is omitted.

The driver may include a scan driver configured to provide a scan signal to the pixels PXL through a scan line, an emission driver configured to provide an emission control signal to the pixels PXL through an emission control line, a data driver configured to provide a data signal to the pixels PXL through a data line, and a timing controller. The timing controller may control the scan driver, the emission driver, and the data driver.

Figure 13A:
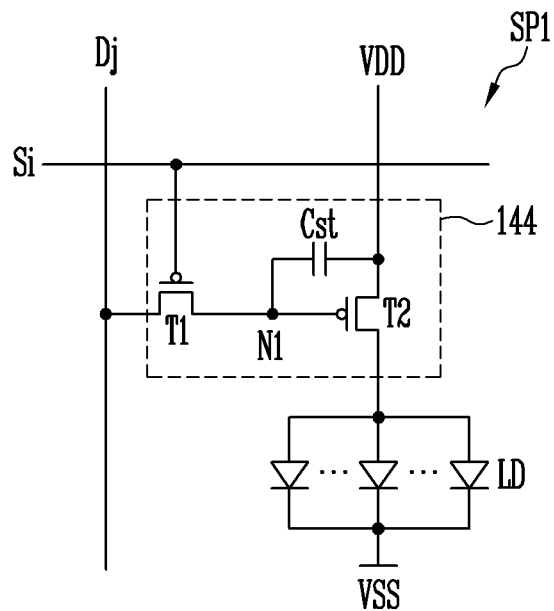
FIGS. 13A to 13C are circuit diagrams illustrating examples of a unit emission area of the display device of FIG. 12 in accordance with various embodiments.
Figure 13B:
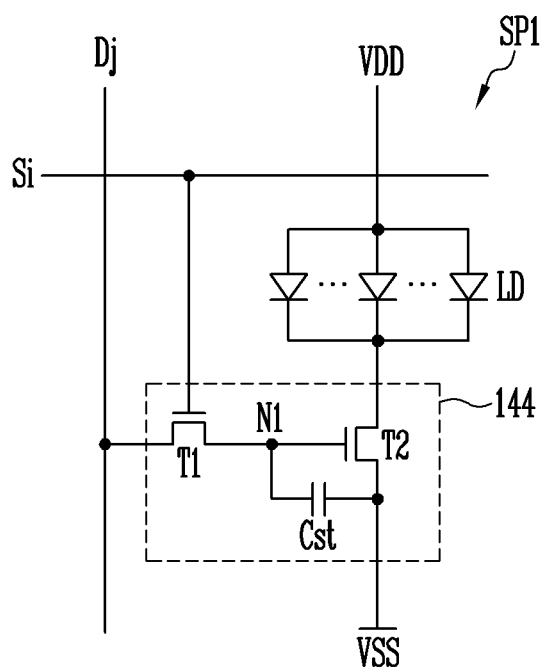
Figure 13C:
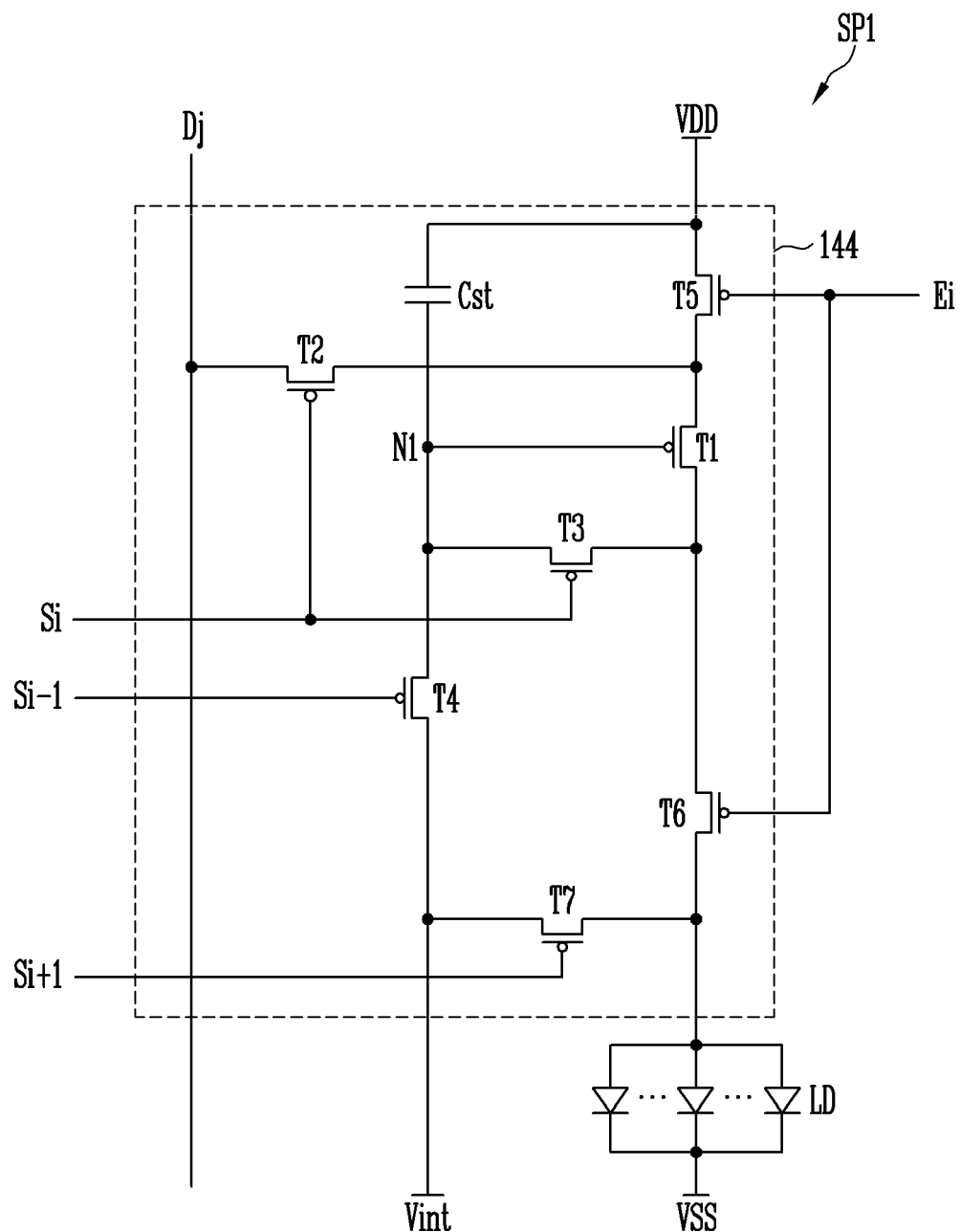

FIGS. 13A to 13C are circuit diagrams illustrating examples of a unit emission area of the display device of FIG. 12 in accordance with various embodiments.

Referring to FIGS. 13A to 13C, each of the first to third sub-pixels may be configured of an active pixel. However, the type, the configuration, and/or the driving method of each of the first to third sub-pixels is not particularly limited. For example, each of the first to third sub-pixels may be configured of a pixel of a passive or active display device which can have various known structures.

Furthermore, referring to FIGS. 13A to 13C, the first to third sub-pixels may have substantially the same structure or similar structures. Hereinafter, for convenience sake, the first sub-pixel of the first to third sub-pixels will be described as a representative example.

Referring to FIGS. 1A, 12, and 13A, the first sub-pixel SP1 may include a plurality of light emitting elements LD coupled in parallel to each other between a first driving power supply VDD and a second driving power supply VSS, and a pixel driving circuit 144 configured to drive the light emitting elements LD.

A first electrode (e.g., an anode electrode) of each of the light emitting elements LD may be coupled to the first driving power supply VDD via the pixel driving circuit 144. A second electrode (e.g., a cathode electrode) of each of the light emitting elements LD may be coupled to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting elements LD.

Each of the light emitting elements LD may emit light at a luminance corresponding to driving current that is controlled by the pixel driving circuit 144.

Although FIGS. 13A to 13C illustrate embodiments in which the light emitting elements LD are coupled in parallel to each other in the same direction (e.g., a forward direction) between the first and second driving power supplies VDD and VSS, the present disclosure is not limited thereto. For example, in an embodiment, some of the light emitting elements LD may be coupled in forward direction between the first and second driving power supplies VDD and VSS, and the other ones of the light emitting elements LD may be coupled in a reverse direction (e.g., the other ones of the light emitting elements LD may be reverse biased). One of the first and second driving power supplies VDD and VSS may be supplied in the form of alternating voltage. In this case, the light emitting elements LD may alternately emit light by the same connection direction groups. Alternatively, in an embodiment, the first sub-pixel SP1 may include a single light emitting element LD.

In an embodiment of the present disclosure, the pixel driving circuit 144 may include first and second transistors T1 and T2, and a storage capacitor Cst. However, the structure of the pixel driving circuit 144 is not limited to the embodiment illustrated in FIG. 13A.

A first electrode of the first transistor (e.g., T1 or a switching transistor) is coupled to a j-th data line Dj, and a second electrode thereof is coupled to a first node N1. Here, the first electrode and the second electrode of the first transistor T1 may be different electrodes. For example, if the first electrode is a source electrode, the second electrode is a drain electrode. A gate electrode of the first transistor T1 is coupled to a i-th scan line Si.

When a scan signal having a voltage (e.g., a low-level voltage) capable of turning on the first transistor T1 is supplied from the scan line Si, the first transistor T1 is turned on to electrically couple the data line Dj with the first node N1. Here, a data signal of a corresponding frame is supplied to the data line Dj, whereby the data signal is transmitted to the first node N1. The data signal transmitted to the first node N1 is charged to the storage capacitor Cst.

A first electrode of the second transistor (e.g., T2 or a driving transistor) is coupled to the first driving power supply VDD, and a second electrode thereof is electrically coupled to the first electrode of each of the light emitting elements LD. A gate electrode of the second transistor T2 is coupled to the first node N1. The second transistor T2 may control the amount of driving current to be supplied to the light emitting elements LD in response to the voltage of the first node N1.

One electrode of the storage capacitor Cst is coupled to the first driving power supply VDD, and the other electrode thereof is coupled to the first node N1. The storage capacitor Cst may charge to a voltage corresponding to the data signal supplied to the first node N1, and may maintain the charged voltage until a data signal of a subsequent frame is supplied.

For the sake of explanation, FIG. 13A illustrates the pixel driving circuit 144 having a relatively simple structure including the first transistor T1 configured to transmit the data signal to the first sub-pixel SP1, the storage capacitor Cst configured to store the data signal, and the second transistor T2 configured to supply driving current corresponding to the data signal to the light emitting elements LD.

However, the present disclosure is not limited to the foregoing structure, and the structure of the pixel driving circuit 144 may be changed in various ways. For example, the pixel driving circuit 144 may further include at least one transistor element such as a transistor element configured to compensate for the threshold voltage of the second transistor T2, a transistor element configured to initialize the first node N1, and/or a transistor element configured to control an emission time of the light emitting element LD, or other circuit elements such as a boosting capacitor for boosting the voltage of the first node N1.

Furthermore, although in FIG. 13A the transistors, e.g., the first and second transistors T1 and T2, included in the pixel driving circuit 144 have been illustrated as being formed of P-type transistors, the present disclosure is not limited to this. In other words, at least one of the first and second transistors T1 and T2 included in the pixel driving circuit 144 may be formed of an N-type transistor.

Referring to FIGS. 1A, 12, and 13B, the first and second transistors T1 and T2 in accordance with an embodiment of the present disclosure may be formed of N-type transistors. The configuration and operation of the pixel driving circuit 144 illustrated in FIG. 13B, other than a change in connection positions of some components (e.g., the storage capacitor Cst and the light emitting elements LD) due to a change in the type of transistor, are similar to those of the pixel driving circuit 144 of FIG. 13A. Therefore, detailed descriptions pertaining to this will be omitted.

In an embodiment of the present disclosure, the configuration of the pixel driving circuit 144 is not limited to the embodiments illustrated in FIGS. 13A and 13B. For example, the pixel driving circuit 144 may be configured in the same manner as that of an embodiment illustrated in FIG. 13C.

Referring to FIGS. 1A, 12, and 13C, the pixel driving circuit 144 may be coupled to the i-th scan line Si and the j-th data line Dj of the first sub-pixel SP1. For example, if the first sub-pixel SP1 is disposed on an i-th row and a j-th column of the display area DA, the pixel driving circuit 144 of the first sub-pixel SP1 may be coupled to an i-th scan line Si and a j-th data line Dj of the display area DA.

In an embodiment, the pixel driving circuit 144 may be further coupled to at least one scan line. For example, the sub-pixel SP1 disposed on the i-th row of the display area DA may be further coupled to an (i−1)-th scan line Si−1 (e.g., a preceding scan line) and/or an (i+1)-th scan line Si+1 (e.g., a scan line of a subsequent stage).

In an embodiment, the pixel driving circuit 144 may be coupled not only to the first and second driving power supplies VDD and VSS but also to a third power supply. For example, the pixel driving circuit 144 may also be coupled to an initialization power supply Vint.

Here, the pixel driving circuit 144 may include first to seventh transistors T1 to T7, and a storage capacitor Cst.

A first electrode, e.g., a source electrode, of the first transistor (e.g., a driving transistor) T1 may be coupled to the first driving power supply VDD via the fifth transistor T5, and a second electrode, e.g., a drain electrode, thereof may be coupled to one ends of light emitting elements LD via the sixth transistor T6. A gate electrode of the first transistor T1 may be coupled to a first node N1. The first transistor T1 may control driving current flowing between the first driving power supply VDD and the second driving power supply VSS via the light emitting elements LD in response to the voltage of the first node N1.

The second transistor (e.g., a switching transistor) T2 may be coupled between the j-th data line Dj coupled to the first sub-pixel SP1 and the source electrode of the first transistor T1. A gate electrode of the second transistor T2 is coupled to the i-th scan line Si coupled to the first sub-pixel SP1. When a scan signal having a gate-on voltage (e.g., a low-level voltage) is supplied from the i-th scan line Si, the second transistor T2 is turned on to electrically couple the j-th data line Dj to the source electrode of the first transistor T1. Hence, if the second transistor T2 is turned on, a data signal supplied from the j-th data line Dj may be transmitted to the first transistor T1.

The third transistor T3 is coupled between the drain electrode of the first transistor T1 and the first node N1. A gate electrode of the third transistor T3 may be coupled to the i-th scan line Si. When a scan signal having a gate-on voltage is supplied from the scan line Si, the third transistor T3 may be turned on to electrically couple the drain electrode of the first transistor T1 to the first node N1. Therefore, when the third transistor T3 is turned on, the first transistor T1 may be connected in the form of a diode (e.g., the first transistor T1 may be diode-connected).

The fourth transistor T4 is coupled between the first node N1 and the initialization power supply Vint. A gate electrode of the fourth transistor T4 is coupled to a preceding scan line, e.g., an (i−1)-th scan line Si−1. When a scan signal of a gate-on voltage is supplied to the (i−1)-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 is coupled between the first driving power supply VDD and the first transistor T1. A gate electrode of the fifth transistor T5 may be coupled to a corresponding emission control line, e.g., an i-th emission control line Ei. The fifth transistor T5 may be turned off when an emission control signal having a gate-off voltage is supplied to the i-th emission control line Ei, and may be turned on in other cases.

The sixth transistor T6 is coupled between the first transistor T1 and first ends of the light emitting elements LD. A gate electrode of the sixth transistor T6 is coupled to the i-th emission control line Ei. The sixth transistor T6 may be turned off when an emission control signal having a gate-off voltage is supplied to the i-th emission control line Ei, and may be turned on in other cases.

The seventh transistor T7 is coupled between the first ends of the light emitting elements LD and the initialization power supply Vint. A gate electrode of the seventh transistor T7 is coupled to any one of scan lines of a subsequent stage, e.g., to the i+1-th scan line Si+1. When a scan signal of a gate-on voltage is supplied to the i+1-th scan line Si+1, the seventh transistor T7 may be turned on so that the voltage of the initialization power supply Vint may be supplied to the first ends of the light emitting elements LD.

The storage capacitor Cst may be coupled between the first driving power supply VDD and the first node N1. The storage capacitor Cst may store a voltage corresponding both to the data signal applied to the first node N1 during each frame period and to the threshold voltage of the first transistor T1.

For convenience sake, FIG. 13C illustrates that all of the first to seventh transistors T1 to T7 are formed of P-type transistors, but the present disclosure is not limited thereto. For example, at least one of the first to seventh transistors T1 to T7 included in the pixel driving circuit 144 may be formed of an N-type transistor, or all of the first to seventh transistors T1 to T7 may be formed of N-type transistors.

Figure 14:
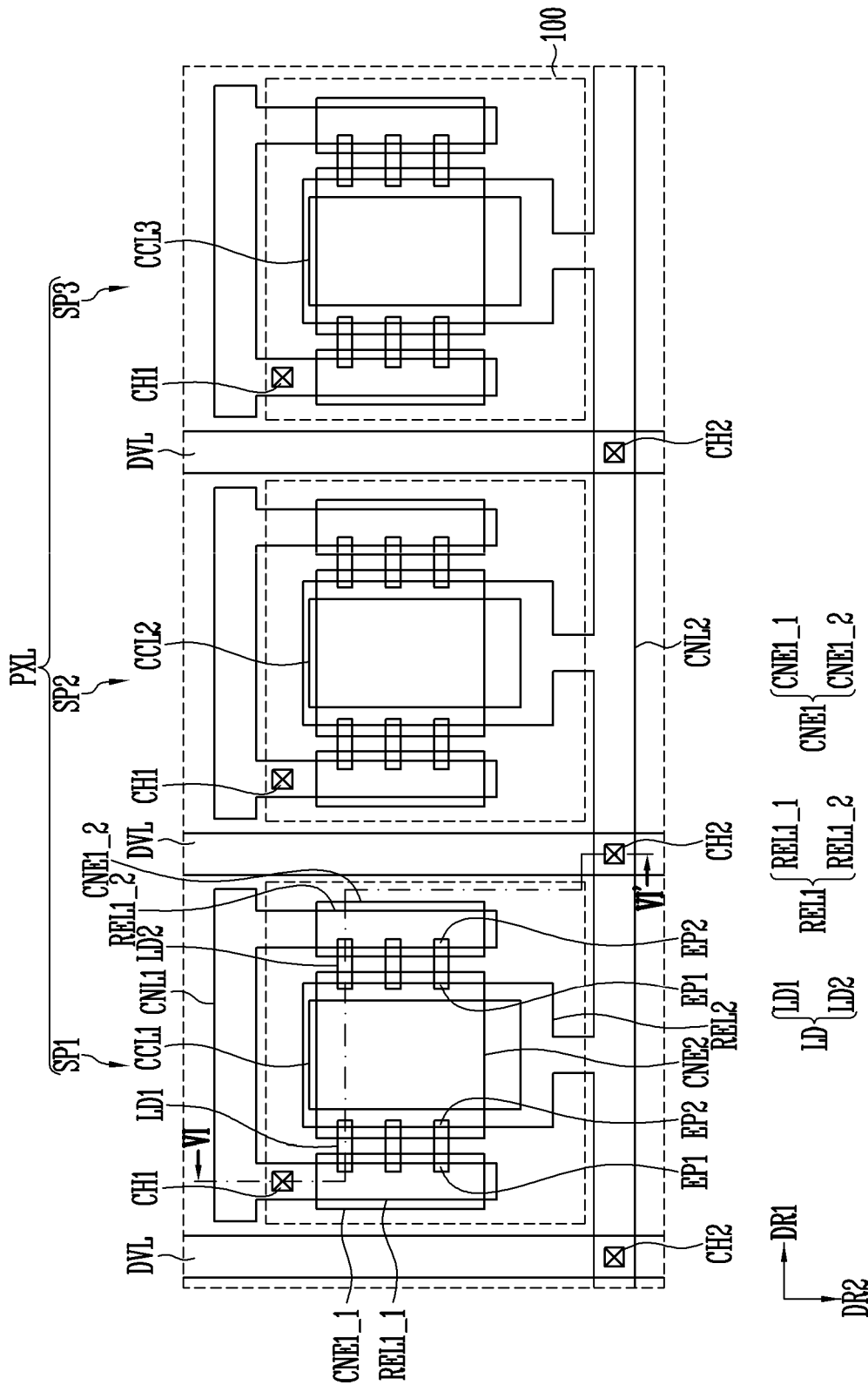
FIG. 14 is a plan diagram schematically illustrating first to third sub-pixels included in one of pixels illustrated in FIG. 12.
Figure 15A:
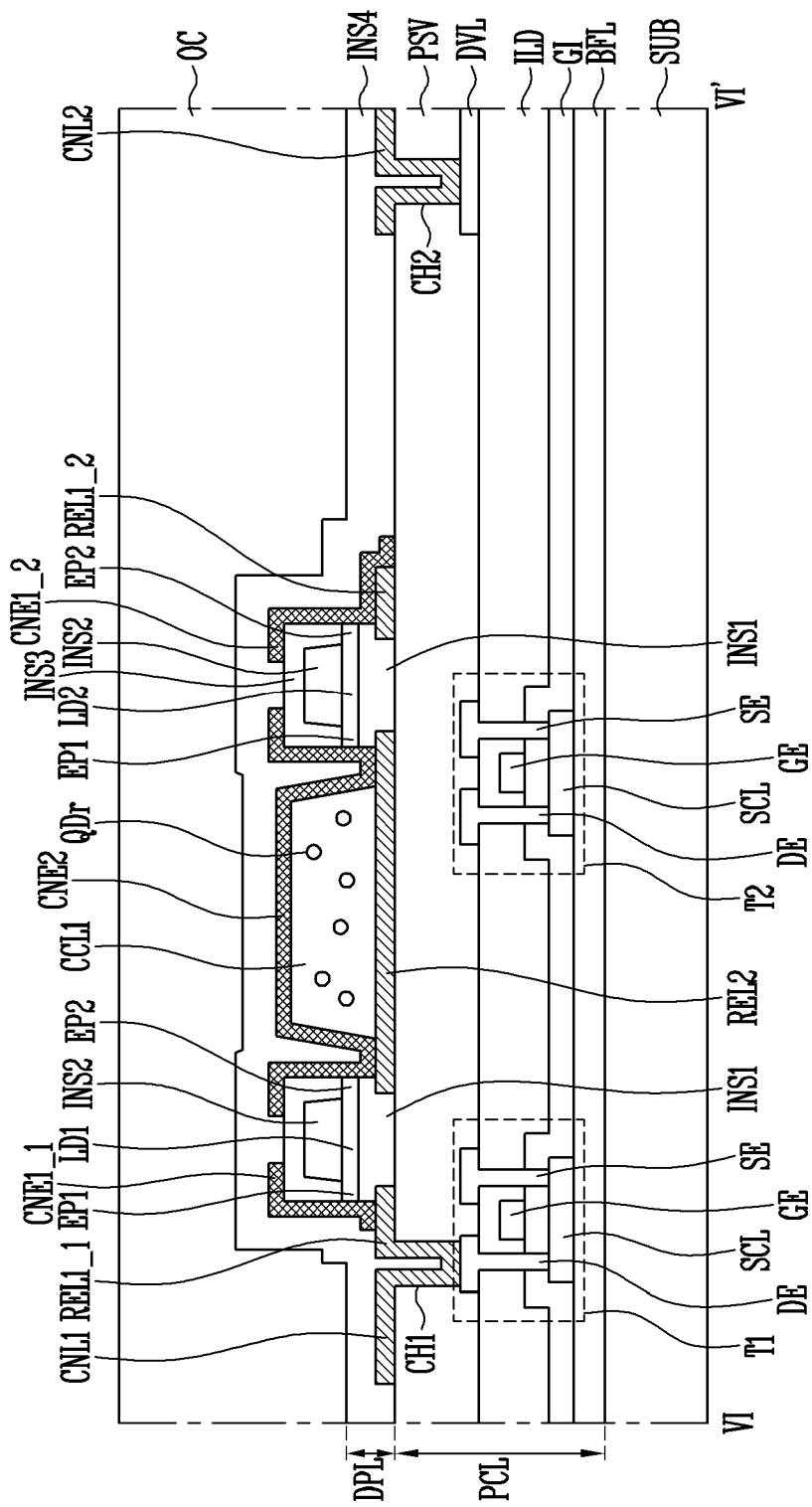
FIG. 15A is a sectional diagram taken along the line VI-VI' of FIG. 14.

FIG. 14 is a plan diagram schematically illustrating first to third sub-pixels included in one of pixels illustrated in FIG. 12. FIG. 15A is a sectional diagram taken along the line VI-VI' of FIG. 14.

In an embodiment of the present disclosure, the following description will be focused on differences from the foregoing embodiments to avoid repetitive explanation. Components which are not separately explained in the following description of the present embodiment comply with that of the foregoing embodiments. The same reference numeral will be used to designate the same component, and a similar reference numeral will be used to designate a similar component.

In FIG. 14, for the sake of explanation, a plurality of light emitting elements provided in each sub-pixel are illustrated as being horizontally arranged. However, the arrangement of the light emitting elements is not limited thereto. For example, at least some of the light emitting elements may be arranged in a direction intersecting with (or crossing) the horizontal direction.

Furthermore, for the sake of explanation, illustration of transistors coupled to the light emitting elements, and signal lines coupled to the transistors has been omitted in FIG. 14.

Moreover, although FIGS. 14 and 15A illustrate a simplified structure of the one pixel, e.g., showing that each electrode has only a single electrode layer, the present disclosure is not limited thereto.

Referring to FIGS. 1A, 12, 14, and 15A, the display device in accordance with an embodiment of the present disclosure may include a substrate SUB on which a plurality of pixels PXL are provided. Each of the pixels PXL may include a first sub-pixel SP1, a second sub-pixel SP2, and a third sub-pixel SP3 which are provided on the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel.

The unit emission area 100 of each of the first to third sub-pixels SP1 to SP3 may include the substrate SUB, a pixel circuit layer PCL provided on the substrate SUB, and a display element layer DPL provided on the pixel circuit layer PCL.

In an embodiment of the present disclosure, the unit emission area 100 may include a pixel area of a corresponding sub-pixel. For example, the unit emission area 100 of the first sub-pixel SP1 may include a pixel area of the first sub-pixel SP1. The unit emission area 100 of the second sub-pixel SP2 may include a pixel area of the second sub-pixel SP2. The unit emission area 100 of the third sub-pixel SP3 may include a pixel area of the third sub-pixel SP3.

The pixel circuit layer PCL of each of the first to third sub-pixels SP1 to SP3 may include a buffer layer BFL disposed on the substrate SUB, first and second transistors T1 and T2 disposed on the buffer layer BFL, and a driving voltage line DVL. Furthermore, the pixel circuit layer PCL of each of the first to third sub-pixels SP1 to SP3 may further include a passivation layer PSV which is provided on the first and second transistors T1 and T2 and the driving voltage line DVL.

The substrate SUB may include an insulating material such as glass, an organic polymer, or crystal. Furthermore, the substrate SUB may be made of material having flexibility so as to be bendable or foldable, and may have a single-layer or multi-layer structure.

The buffer layer BFL may be provided on the substrate SUB and may prevent impurities from diffusing into the first and second transistors T1 and T2. The buffer layer BFL may be omitted depending on the material of the substrate SUB or processing conditions.

The first transistor T1 may be a driving transistor which is electrically coupled to some of the light emitting elements LD provided in the display element layer DPL of a corresponding sub-pixel to drive the light emitting elements LD. The second transistor T2 may be a switching transistor configured to switch the first transistor T1.

Each of the first and second transistors T1 and T2 may include a semiconductor layer SCL, a gate electrode GE, and source and drain electrodes SE and DE.

The semiconductor layer SCL may be disposed on the buffer layer BFL. The semiconductor layer SCL may include a source area which comes into contact with the source electrode SE, and a drain area which comes into contact with the drain electrode DE. An area between the source area and the drain area may be a channel area.

The semiconductor layer SCL may be a semiconductor pattern formed of polysilicon, amorphous silicon, an oxide semiconductor, etc. The channel area may be an intrinsic semiconductor, which is an undoped semiconductor pattern. Each of the source area and the drain area may be a semiconductor pattern doped with impurities.

The gate electrode GE may be provided on the semiconductor layer SCL with a gate insulating layer GI interposed therebetween. An interlayer insulating layer ILD may be provided on the gate electrodes GE of the first and second transistors T1 and T2 and the gate insulating layer GI to completely cover the gate electrodes GE and the gate insulating layer GI.

The source electrode SE and the drain electrode DE may respectively come into contact with the source area and the drain area of the semiconductor layer SCL through corresponding contact holes which pass through the interlayer insulating layer ILD and the gate insulating layer GI.

The driving voltage line DVL may be provided on the interlayer insulating layer ILD, but the present disclosure is not limited thereto. In some embodiments, the driving voltage line DVL may be provided on any one of insulating layers included in the pixel circuit layer PCL. The second driving power supply (VSS of FIG. 13A) may be applied to the driving voltage line DVL.

The passivation layer PSV may include a first contact hole CH1 which exposes a portion of the drain electrode DE of the first transistor T1, and a second contact hole CH2 which exposes a portion of the driving voltage line DVL.

The display element layer DPL of each of the first to third sub-pixels SP1 to SP3 may include first and second electrodes REL1 and REL2, first and second connection lines CNL1 and CNL2, a plurality of light emitting elements LD, and first and second contact electrodes CNE1 and CNE2 which are provided on the passivation layer PSV.

Each of the light emitting elements LD may be formed of a light emitting diode which is made of material having an inorganic crystal structure and has a subminiature size, e.g., corresponding to a nanoscale or microscale.

A second insulating layer INS2 for covering a portion of an upper surface of each of the light emitting elements LD may be provided on the light emitting elements LD. A first insulating layer INS1 may be provided between each of the light emitting elements LD and the passivation layer PSV.

A third insulating layer INS3 may be provided on the second insulating layer INS2 and each of the light emitting elements LD. The third insulating layer INS3 may planarize a stepped portion formed by the second insulating layer INS2 and the light emitting elements LD and may cover the opposite ends EP1 and EP2 of each of the light emitting elements LD that are exposed out of the second insulating layer INS2.

The first connection line CNL1 may extend from each of the first to third sub-pixels SP1 to SP3 in a first direction DR1. The first connection line CNL1 may be provided in only one corresponding sub-pixel so as to independently drive each of the first to third sub-pixels SP1 to SP3.

The second connection line CNL2 may extend in a direction parallel to a direction in which the first connection line CNL1 extends. The second connection line CNL2 may be provided in common to the first to third sub-pixels SP1 to SP3. Therefore, the first to third sub-pixels SP1 to SP3 may be coupled in common to the second connection line CNL2.

The first electrode REL1 may include 1-1-th and 1-2-th electrodes REL1_1 and REL1_2 which diverge from the first connection line CNL1 in a second direction DR2 intersecting with (or crossing) the first direction DR1. The second electrode REL2 may extend from the second connection line CNL2 in the second direction DR2.

In an embodiment of the present disclosure, the light emitting elements LD may be divided into a plurality of first light emitting elements LD1 aligned between the 1-1-th electrode REL1_1 and the second electrode REL2, and a plurality of second light emitting elements LD2 aligned between the second electrode REL2 and the 1-2-th electrode REL1_2. In an embodiment of the present disclosure, the first and second light emitting elements LD1 and LD2 may emit blue light having a relatively short wavelength in a visible ray area.

In a plan view, the first and second electrodes REL1 and REL2 may be provided on the substrate SUB at positions spaced from each other with the light emitting elements LD interposed therebetween, and thus electrically and/or physically separated from each other.

In an embodiment of the present disclosure, the first electrode REL1 may be electrically coupled to the drain electrode DE of the first transistor T1 through the first contact hole CH1 of the passivation layer PSV. Hence, a signal applied to the first transistor T1 may be transmitted to the first electrode REL1. The first electrode REL1 may be disposed adjacent to one end of the opposite ends EP1 and EP2 of each of the light emitting elements LD, and may be electrically coupled to one end of the opposite end EP1 and EP2 each of the light emitting elements LD through the first contact electrode CNE1. Therefore, a signal of the first transistor T1 that is applied to the first electrode REL1 may be transmitted to each of the light emitting elements LD through the first contact electrode CNE1.

The second electrode REL2 may be electrically coupled to the driving voltage line DVL through the second contact hole CH2 of the passivation layer PSV (e.g., because the second electrode REL2 may extend from the second connection line CNL2, which is electrically coupled to the driving voltage line DVL through the second contact hole CH2). Consequently, the second driving power supply VSS applied to the driving voltage line DVL may be transmitted to the second electrode REL2. The second electrode REL2 may be disposed adjacent to the other one of the opposite ends of each of the light emitting elements LD, and may be electrically coupled to each of the light emitting elements LD through the second contact electrode CNE2. Hence, the second driving power supply VSS applied to the second electrode REL2 may be transmitted to each of the light emitting elements LD.

The first and second contact electrodes CNE1 and CNE2 may be provided at the same plane and may be disposed on the third insulating layer INS3 at positions spaced from each other (e.g., spaced from each other by a predetermined distance). Hence, the first contact electrode CNE1 and the second contact electrode CNE2 may be electrically and/or physically separated from each other.

A fourth insulating layer INS4 may be provided on the first and second contact electrodes CNE1 and CNE2. An overcoat layer OC may be provided on the fourth insulating layer INS4.

The display element layer DPL of each of the first to third sub-pixels SP1 to SP3 may include a color conversion layer. For example, the display element layer DPL of the first sub-pixel SP1 may include a first color conversion layer CCL1. The display element layer DPL of the second sub-pixel SP2 may include a second color conversion layer CCL2. The display element layer DPL of the third sub-pixel SP3 may include a third color conversion layer CCL3.

In an embodiment of the present disclosure, the first color conversion layer CCL1 may include red quantum dots QDr as photoconversion particles for converting the blue light emitted from the light emitting elements LD into red light.

The second color conversion layer CCL2 may include green quantum dots (not illustrated) as photoconversion particles for converting the blue light emitted from the light emitting elements LD into green light.

The third color conversion layer CCL3 may include a transparent layer for allowing the blue light emitted from the light emitting elements LD to pass therethrough directly in a direction (e.g., a frontal direction) in which an image of the display device is displayed. The transparent layer may be formed of a transparent polymer, and may emit, directly in the frontal direction, the blue light emitted from the light emitting elements LD provided in the third sub-pixel SP3.

The third color conversion layer CCL3 including the transparent layer may directly emit the blue light that is incident thereon, without having a separate quantum dot. In an embodiment, the third color conversion layer CCL3 may include a blue color filter in lieu of the transparent layer.

The first to third sub-pixels SP1 to SP3 may have a substantially identical or similar structure. Hereinafter, for convenience sake, the first sub-pixel SP1 of the first to third sub-pixels SP1 to SP3 will be described as a representative example.

The first color conversion layer CCL1 may be provided on the second electrode REL2 between the first light emitting elements LD1 and the second light emitting elements LD2 in the unit emission area 100 of the first sub-pixel SP1. The second contact electrode CNE2 may be provided on the first color conversion layer CCL1.

In a plan view, the first color conversion layer CCL1 may overlap with the second electrode REL2 and the second contact electrode CNE2. In a sectional view, the second contact electrode CNE2 may overlap with the second electrode REL2 on opposite ends of the first color conversion layer CCL1 with the first color conversion layer CCL1 provided under the second contact electrode CNE2 and thus be electrically and/or physically coupled with the second electrode REL2.

As described above, voltages (e.g., predetermined voltages) may be respectively applied to the opposite ends EP1 and EP2 of each of the first and second light emitting elements LD1 and LD2 through the first and second electrodes REL1 and REL2. Hence, each of the light emitting elements LD may emit the blue light. The blue light emitted from the opposite ends EP1 and EP2 of each of the first and second light emitting elements LD1 and LD2 may travel to the first color conversion layer CCL1.

The red quantum dots QDr are excited by the blue light that is incident on the first color conversion layer CCL1 so that the blue light can be absorbed and the red light can be emitted. The red light emitted from the red quantum dots QDr may be emitted in all directions. The red light that is eventually emitted from the first color conversion layer CCL1 may be reflected in the frontal direction of the display device by the first and second electrodes REL1 and REL2 disposed under the first color conversion layer CCL1.

The blue light emitted from each of the light emitting elements LD provided in the second sub-pixel SP2 may travel to the second color conversion layer CCL2. The green quantum dots are excited by the blue light that is incident on the second color conversion layer CCL2 so that the blue light can be absorbed and the green light can be emitted. The green light emitted from the green quantum dots may emit in all directions. The green light that is eventually emitted from the second color conversion layer CCL2 may be reflected in the frontal direction of the display device by the first and second electrodes REL1 and REL2 disposed under the second color conversion layer CCL2.

The blue light emitted from each of the light emitting elements LD provided in the third sub-pixel SP3 may pass through the transparent layer and be reflected in the frontal direction of the display device by the first and second electrodes REL1 and REL2 provided in the third sub-pixel SP3.

Hence, the display device may display an image corresponding to the red light, the green light, and the blue light that are respectively emitted from the first to third sub-pixels SP1 to SP3.

As described above, the display device in accordance with an embodiment of the present disclosure may emit light having an excellent color reproducibility through the first to third color conversion layers CCL1 to CCL3 so that the light output efficiency may be enhanced.

As described above, in the display device in accordance with an embodiment of the present disclosure, the first to third color conversion layers CCL1 to CCL3 may be disposed on the same substrate SUB as that of the light emitting elements LD so that the efficiency of light to be eventually emitted from each of the first to third sub-pixels SP1 to SP3 may be enhanced.

Figure 15B:
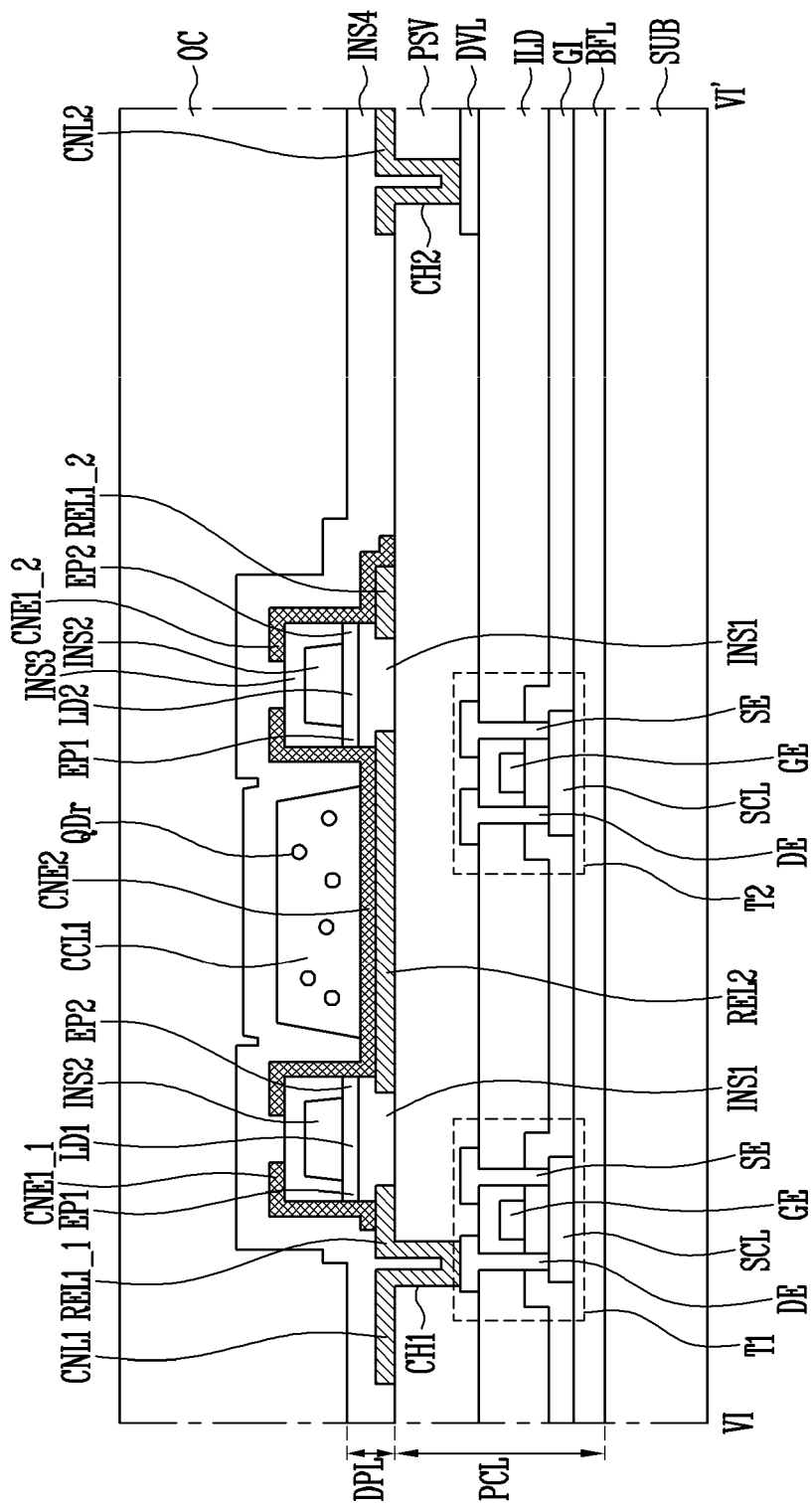
FIGS. 15B and 15C illustrate a display device in accordance with an embodiment of the present disclosure, and is a sectional diagram corresponding to the line VI-VI' of FIG. 14.

FIG. 15B illustrates a display device in accordance with an embodiment of the present disclosure, and is a sectional diagram corresponding to the line VI-VI' of FIG. 14.

The display device illustrated in FIG. 15B, other than the fact that a first color conversion layer is disposed on a second contact electrode CNE2, may have a configuration substantially same or similar to that of the display device of FIGS. 14 and 15A.

Therefore, to avoid redundant explanation, the description of the display device of FIG. 15B will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 12, 14, and 15B, first and second connection lines CNL1 and CNL2, first and second electrodes REL1 and REL2, first and second contact electrodes CNE1 and CNE2, and a first color conversion layer CCL1 may be provided in the unit emission area 100 of the first sub-pixel SP1.

The first and second electrodes REL1 and REL2 may be provided at the same plane and spaced from each other (e.g., spaced from each other by a predetermined distance).

The first contact electrode CNE1 may be provided on the first electrode REL1 and may be electrically and/or physically coupled with the first electrode REL1. The second contact electrode CNE2 may be provided on the second electrode REL2 and may be electrically and/or physically coupled with the second electrode REL2. The first and second contact electrodes CNE1 and CNE2 may be provided at the same plane and spaced form each other (e.g., spaced from each other by a predetermined distance).

The first color conversion layer CCL1 may include red quantum dots QDr for converting blue light emitted from the light emitting elements LD into red light. The first color conversion layer CCL1 may be provided on the second contact electrode CNE2 in the unit emission area 100 of the first sub-pixel SP1 and may overlap with the second electrode REL2 and the second contact electrode CNE2. The first color conversion layer CCL1 may be formed and/or provided on the second contact electrode CNE2 by an exposure method or the like after the first and second contact electrodes CNE1 and CNE2 are formed on the pixel circuit layer PCL of the first sub-pixel SP1.

The red light that is eventually emitted from the first color conversion layer CCL1 may be reflected in the frontal direction of the display device by the first and second electrodes REL1 and REL2 disposed under the first color conversion layer CCL1.

Figure 15C:
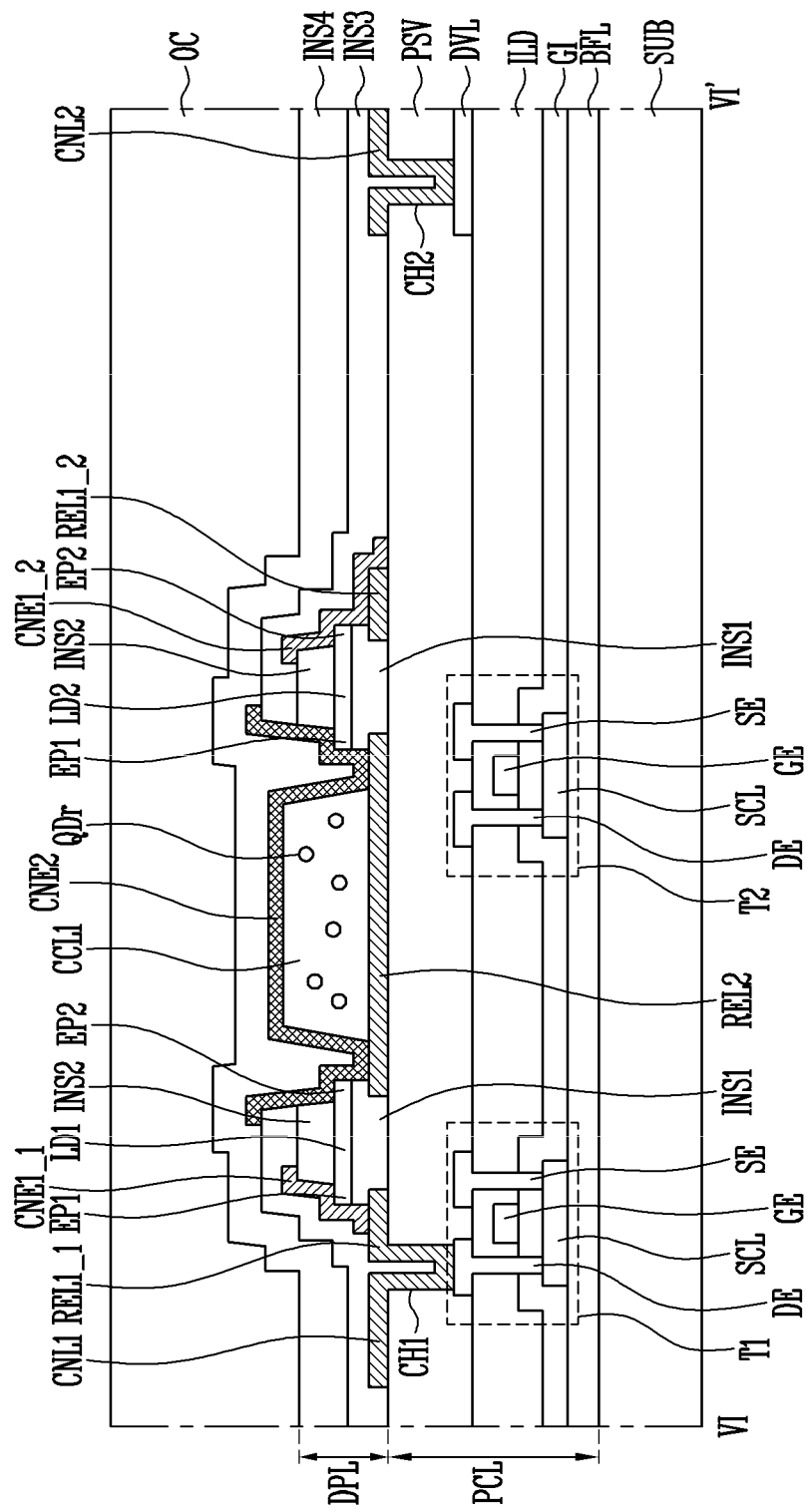
Figure 16A:
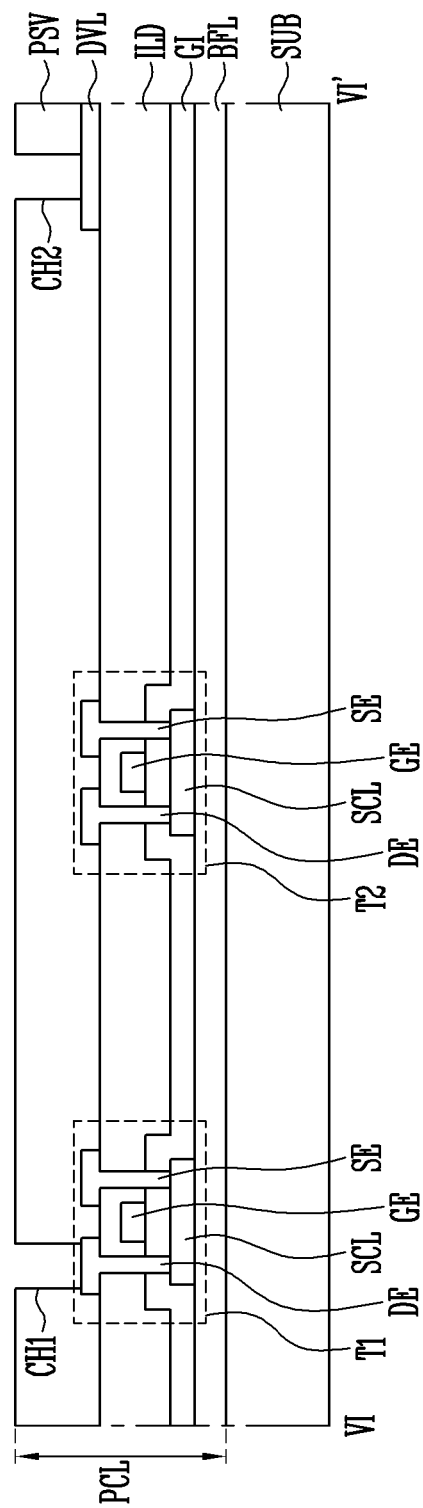
FIGS. 16A to 16H are sectional diagrams sequentially illustrating a method of fabricating the display device of FIG. 15A.
Figure 16B:
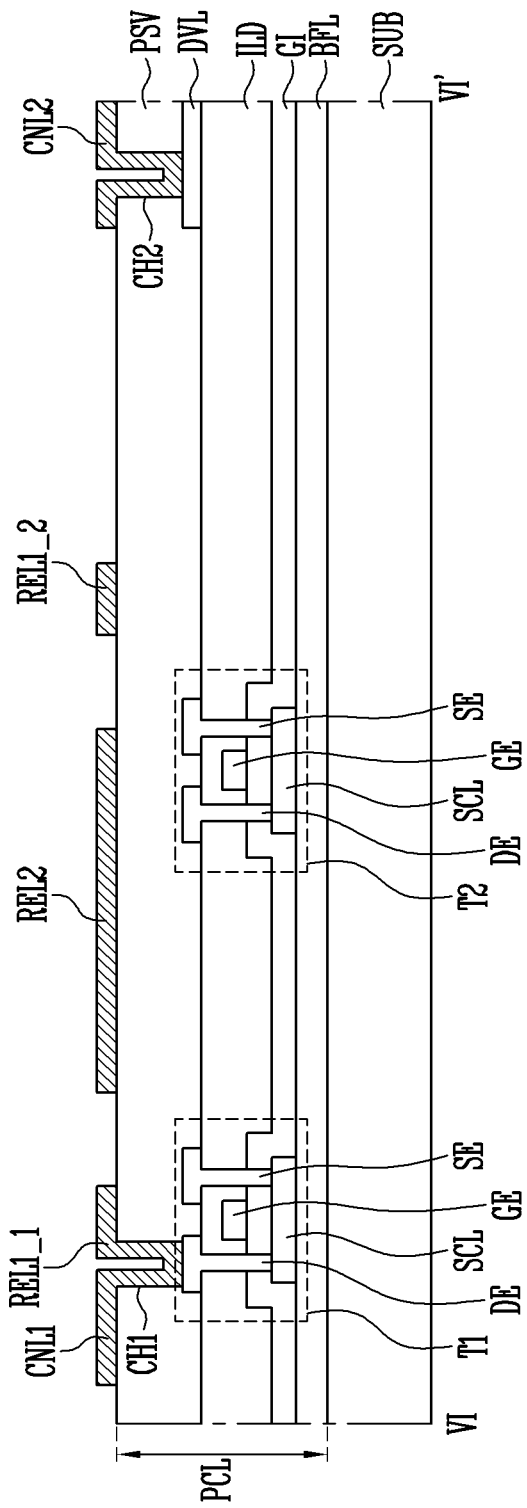
Figure 16C:
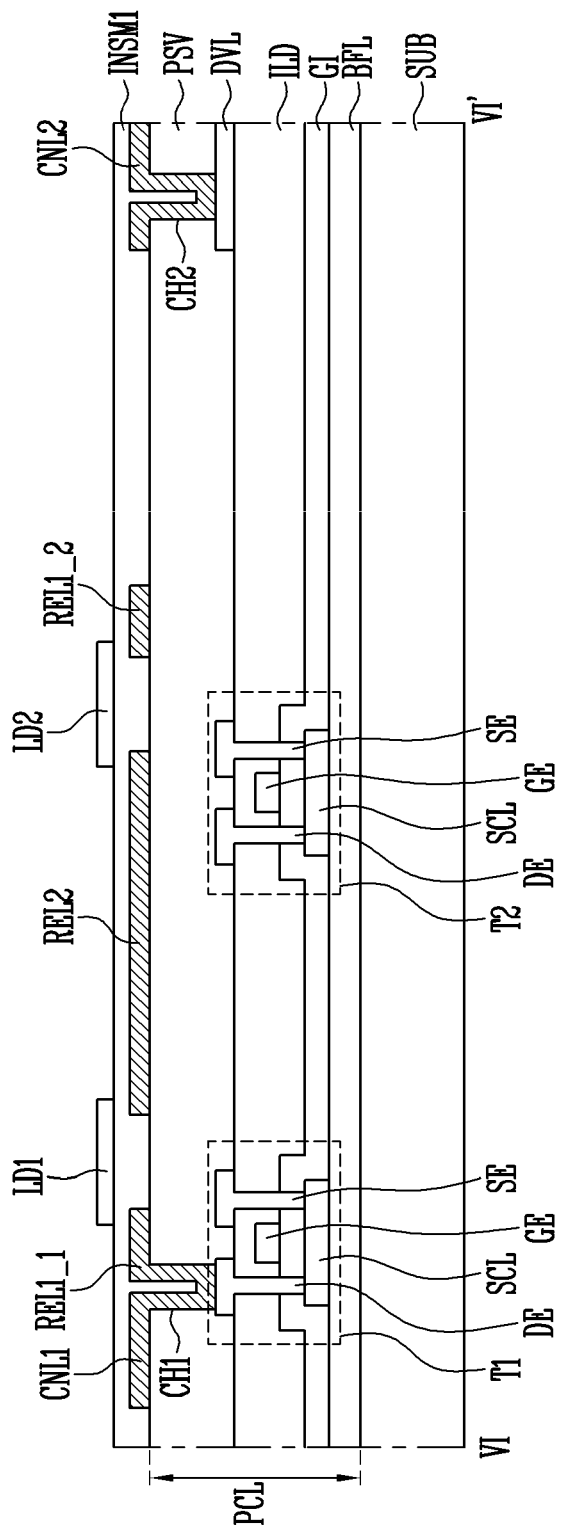
Figure 16D:
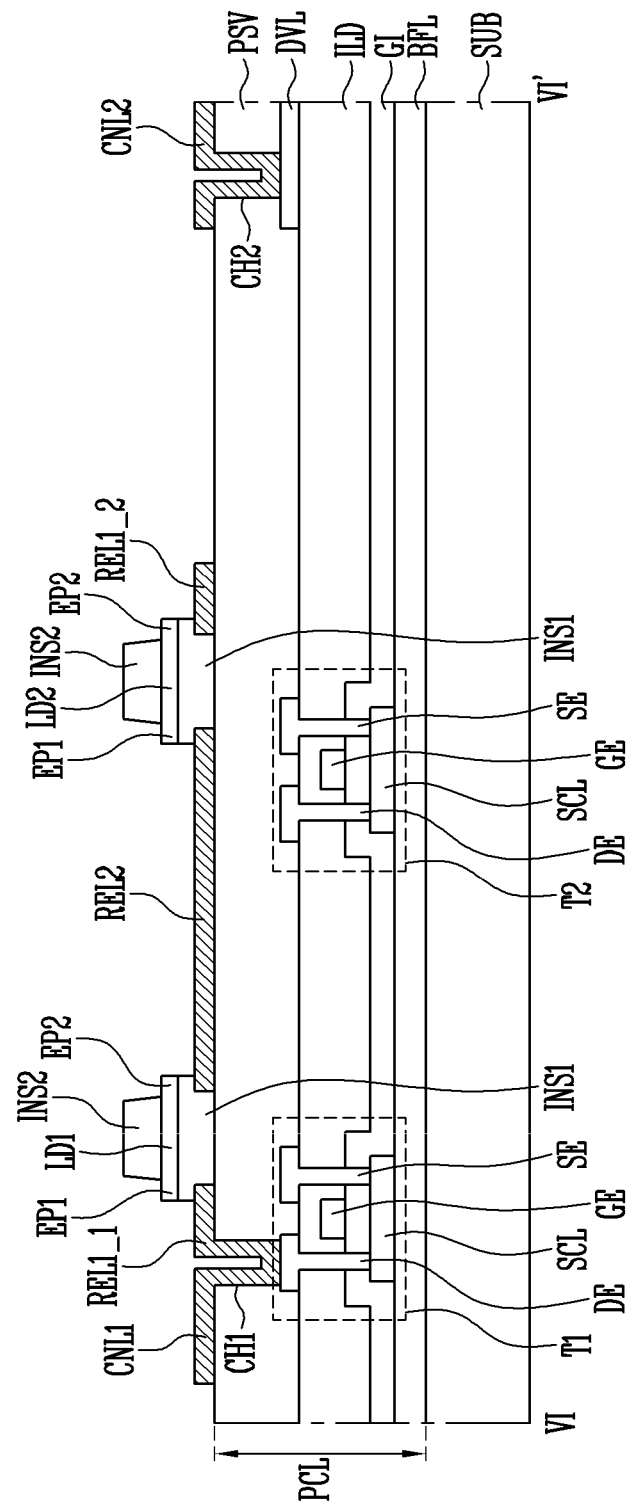
Figure 16E:
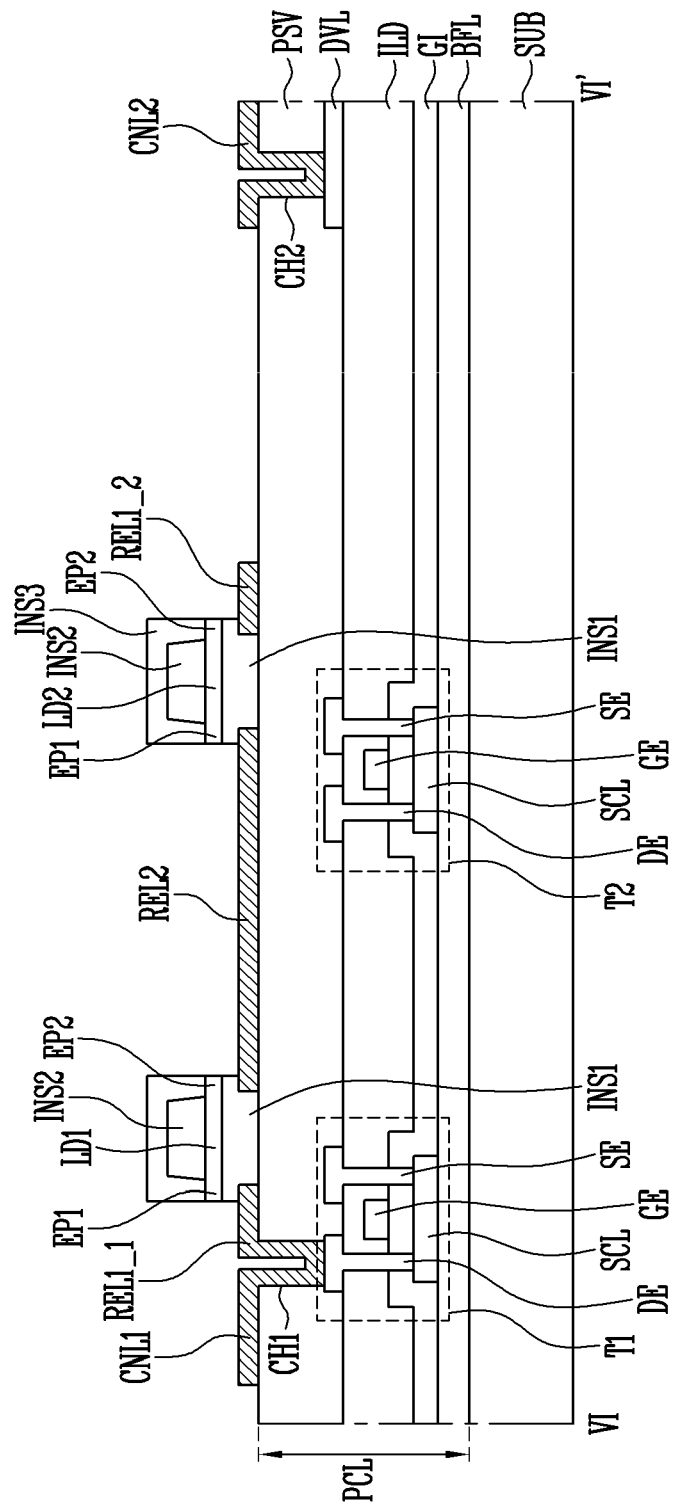
Figure 16F:
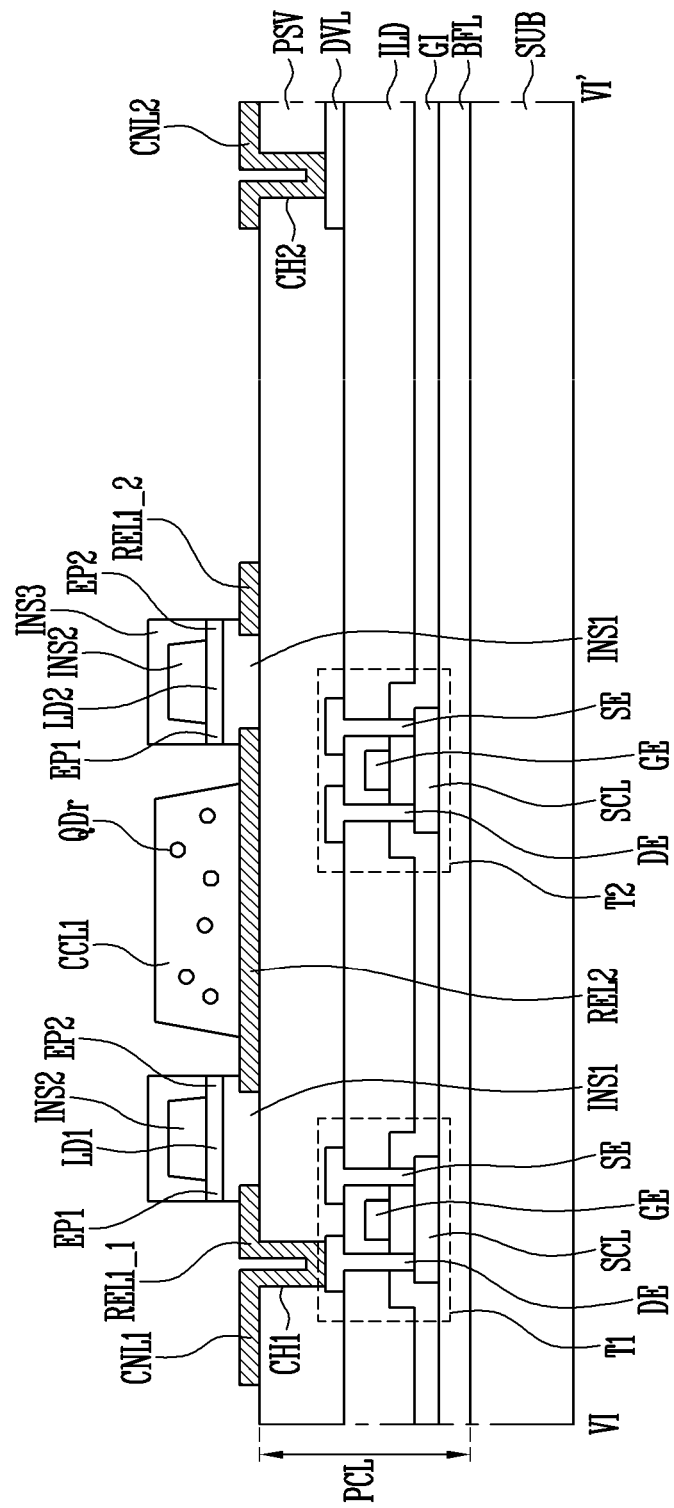
Figure 16G:
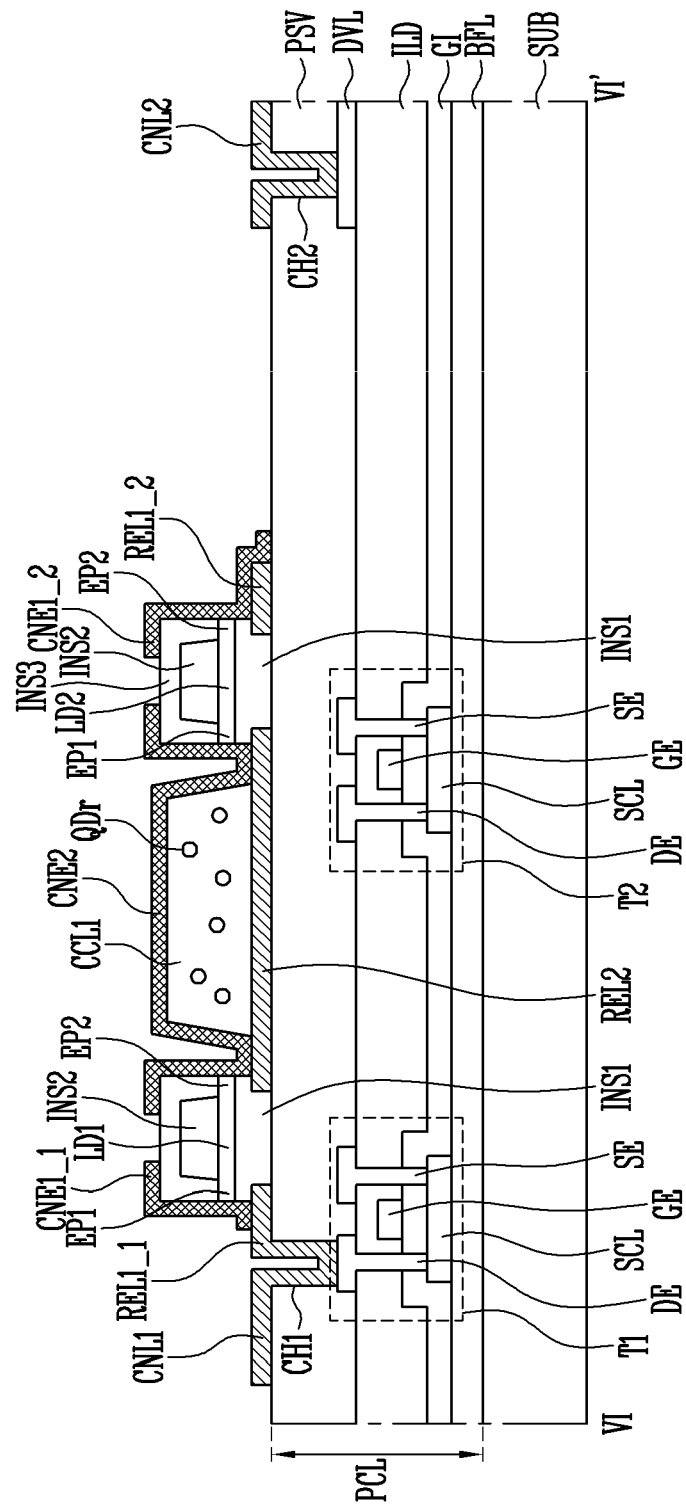
Figure 16H:
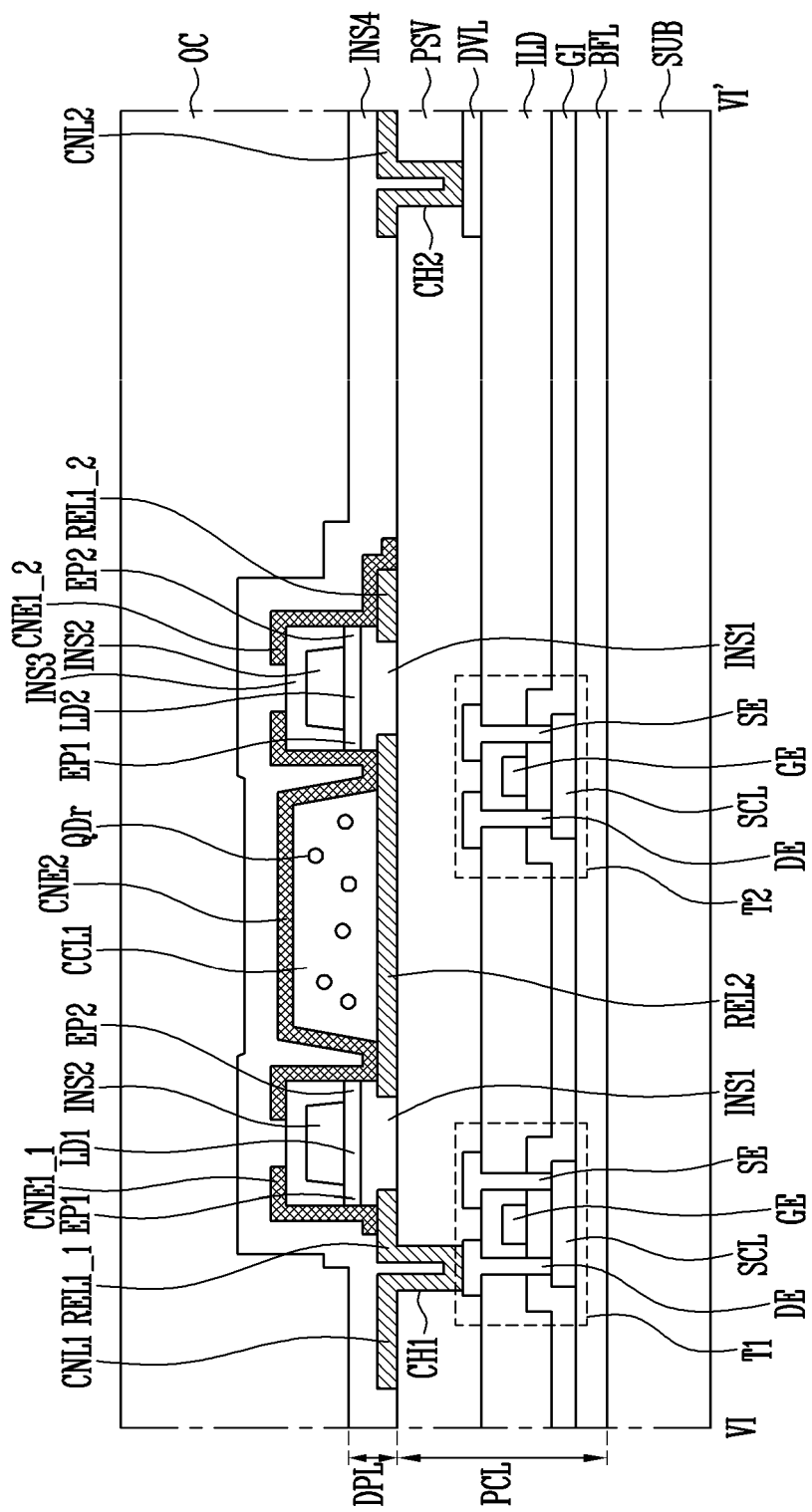

FIG. 15C illustrates a display device in accordance with an embodiment of the present disclosure, and is a sectional diagram corresponding to the line VI-VI' of FIG. 14.

The display device illustrated in FIG. 15C, other than the fact that first and second contact electrodes are disposed on different layers, may have a configuration that is substantially the same or similar to that of the display device of FIGS. 14 and 15A.

Therefore, to avoid redundant explanation, the description of the display device of FIG. 15C will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 12, 14, and 15C, first and second connection lines CNL1 and CNL2, first and second electrodes REL1 and REL2, first and second contact electrodes CNE1 and CNE2, and a first color conversion layer CCL1 may be provided in the unit emission area 100 of the first sub-pixel SP1.

The first and second electrodes REL1 and REL2 may be provided at the same plane and may be spaced form each other (e.g., from each other by a predetermined distance).

The first contact electrode CNE1 may be provided on the first electrode REL1 and one of the opposite ends EP1 and EP2 of each of the light emitting elements LD.

A third insulating layer INS3 may be provided on the first contact electrode CNE1. The third insulating layer INS3 may prevent the first contact electrode CNE1 from being exposed to the outside, thus preventing the first contact electrode CNE1 from being corroded.

The first color conversion layer CCL1 may be formed and/or provided on the second electrode REL2 by an exposure method or the like on the substrate SUB on which the first contact electrode CNE1 is provided. In a plan view, the first color conversion layer CCL1 may overlap with the second electrode REL2.

The first color conversion layer CCL1 may include red quantum dots QDr for converting blue light emitted from the light emitting elements LD into red light. The red light that is eventually emitted from the first color conversion layer CCL1 may be reflected in the frontal direction of the display device by the first and second electrodes REL1 and REL2 disposed under the first color conversion layer CCL1.

The second contact electrode CNE2 may be provided on the first color conversion layer CCL1. The second contact electrode CNE2 may be provided on the second electrode REL2 and the other one of the opposite ends EP1 and EP2 of each of the light emitting elements LD. The other end of each of the light emitting elements LD and the second electrode REL2 may be electrically coupled to each other through the second contact electrode CNE2.

In a sectional view, the second contact electrode CNE2 may overlap with the second electrode REL2 on opposite ends of the first color conversion layer CCL1 with the first color conversion layer CCL1 interposed therebetween. The second contact electrode CNE2 may be provided on a layer different from that of the first contact electrode CNE1.

FIGS. 16A to 16H are sectional diagrams sequentially illustrating a method of fabricating the display device of FIG. 15A.

Referring to FIGS. 1A, 12, 14, 15A, and 16A, a pixel circuit layer PCL is formed on a substrate SUB. The pixel circuit layer PCL may further include first and second transistors T1 and T2, a driving voltage line DVL, and a passivation layer PSV.

The passivation layer PSV includes a first contact hole CH1 which exposes a portion of the drain electrode DE of the first transistor T1, and a second contact hole CH2 which exposes a portion of the driving voltage line DVL.

Referring to FIGS. 1A, 12, 14, 15A, 16A, and 16B, first and second electrodes REL1 and REL2 including conductive material having a high reflectivity, and first and second connection lines CNL1 and CNL2 are formed on the passivation layer PSV.

The first and second electrodes REL1 and REL2 may be disposed on the passivation layer PSV and may be spaced from each other (e.g., spaced from each other by a predetermined distance).

The first electrode REL1 may be integrally provided with the first connection line CNL1, and may be electrically and/or physically coupled with the first connection line CNL1. The first electrode REL1 may be coupled to the drain electrode DE of the first transistor T1 through the first contact hole CH1 of the passivation layer PSV.

The second electrode REL2 may be integrally provided with the second connection line CNL2, and electrically and/or physically coupled with the second connection line CNL2. The second connection line CNL2 may be coupled to the driving voltage line DVL through the second contact hole CH2 of the passivation layer PSV. Because the second connection line CNL2 is electrically coupled with the second electrode REL2, the second electrode REL2 may be coupled to the driving voltage line DVL.

Referring to FIGS. 1A, 12, 14, 15A, and 16A to 16C, a first insulating material layer INSM1 is formed on the substrate SUB on which the first and second electrodes REL1 and REL2, etc. are provided. The first insulating material layer INSM1 may be formed of an inorganic insulating layer including inorganic material, or an organic insulating layer including organic material.

Thereafter, an electric field is formed between the first electrode REL1 and the second electrode REL2 by respectively applying corresponding alignment voltages to the first and second electrodes REL1 and REL2 through the first and second connection lines CNL1 and CNL2. In the case where alternating current power or direct current power having voltage (e.g., a predetermined voltage) and period is repeatedly applied several times to each of the first and second electrodes REL1 and REL2 through the first and second connection lines CNL1 and CNL2, an electric field may be formed between the first and second electrodes REL1 and REL2 by a difference in potential between the first and second electrodes REL1 and REL2.

While the electric field is formed between the first electrode REL1 and the second electrode REL2, a plurality of light emitting elements LD are supplied onto the passivation layer PSV by an inkjet printing method or the like. For example, the light emitting elements LD may be supplied onto the substrate SUB of the unit emission area 100 by disposing a nozzle over the passivation layer PSV and dropping a solvent including the light emitting elements LD onto the passivation layer PSV through the nozzle. The solvent may be any one of acetone, water, alcohol, and toluene, but the present disclosure is not limited thereto. For example, the solvent may include material which may be vaporized at the room temperature or by heat. Furthermore, the solvent may have the form of ink or paste.

The method of supplying the light emitting elements LD onto the substrate SUB is not limited the foregoing method. The method of supplying the light emitting elements LD may be changed. Subsequently, the solvent may be removed.

If the light emitting elements LD are supplied onto the passivation layer PSV, self-alignment of the light emitting elements LD may be induced by the electric field formed between the first electrode REL1 and the second electrode REL2. Hence, the light emitting elements LD may be aligned between the first electrode REL1 and the second electrode REL2.

The light emitting elements LD may include a plurality of first light emitting elements LD1 aligned between the 1-1-th electrode REL1_1 and the second electrode REL2, and a plurality of second light emitting elements LD2 aligned between the second electrode REL2 and the 1-2-th electrode REL1_2.

Referring to FIGS. 1A, 12, 14, 15A, and 16A to 16D, a second insulating material layer (not illustrated) is formed on the substrate SUB after the alignment of the first and second light emitting elements LD1 and LD2 have been completed.

A second insulating layer INS2 is formed by patterning the second insulating material layer using a mask such that the opposite ends EP1 and EP2 of each of the first and second light emitting elements LD1 and LD2 and the first and second electrodes REL1 and REL2 are exposed.

A first insulating layer INS1 may be formed by patterning the first insulating material layer INSM1 together through the foregoing mask process such that the first insulating layer INS1 is disposed only between the first light emitting elements LD1 and the passivation layer PSV and between the second light emitting elements LD2 and the passivation layer PSV.

The first insulating layer INS1 may be disposed under each of the first and second light emitting elements LD1 and LD2 to support each of the first and second light emitting elements LD1 and LD2 and prevent each of the first and second light emitting elements LD1 and LD2 from being removed from the passivation layer PSV.

Referring to FIGS. 1A, 12, 14, 15A, and 16A to 16E, a third insulating material layer (not illustrated) is applied onto the passivation layer PSV on which the second insulating layer INS2 is provided. A third insulating layer INS3 for covering the first and second light emitting elements LD1 and LD2 and the second insulating layer INS2 is formed by patterning the third insulating material layer using a mask.

The third insulating layer INS3 may planarize a stepped portion formed by the second insulating layer INS2 and the first and second light emitting elements LD1 and LD2. The third insulating layer INS3 may include an organic insulating layer formed of organic material.

Referring to FIGS. 1A, 12, 14, 15A, and 16A to 16F, a first color conversion layer CCL1 is formed on the passivation layer PSV on which the third insulating layer INS3 is provided. The first color conversion layer CCL1 may be formed on the passivation layer PSV by an exposure method using a mask.

The first color conversion layer CCL1 may be formed on the second electrode REL2 between the first and second light emitting elements LD1 and LD2. Hence, the first color conversion layer CCL1 and the second electrode REL2 may overlap with each other.

The first color conversion layer CCL1 may include red quantum dots QDr for converting light emitted from the first and second light emitting elements LD1 and LD2 into red light.

The method of forming the first color conversion layer CCL1 on the passivation layer PSV is not limited to the foregoing method. The method of forming the first color conversion layer CCL1 may be changed in various ways. In an embodiment, the first color conversion layer CCL1 may be formed on the second electrode REL2 between the first and second light emitting elements LD1 and LD2 by dropping flowable substances including the red quantum dots QDr in an inkjet printing scheme.

Referring to FIGS. 1A, 12, 14, 15A, and 16A to 16G, first and second contact electrodes CNE1 and CNE2 are formed on the third insulating layer INS3 at position spaced form each other (e.g., spaced from each other by a predetermined distance) by applying a conductive layer (not illustrated) to an overall surface of the passivation layer PSV on which the first color conversion layer CCL1 is provided and then patterning the conductive layer using a mask.

The first contact electrode CNE1 may be provided on the first electrode REL1 and one end of the opposite ends EP1 and EP2 of each of the first and second light emitting elements LD1 and LD2.

The second contact electrode CNE2 may be provided on the second electrode REL2 and the other end of the opposite ends EP1 and EP2 of each of the first and second light emitting elements LD1 and LD2. The second contact electrode CNE2 may be provided on the first color conversion layer CCL1.

Referring to FIGS. 1A, 12, 14, 15A, and 16A to 16H, a fourth insulating layer INS4 is formed on the first and second contact electrodes CNE1 and CNE2.

The fourth insulating layer INS4 may include an inorganic insulating layer formed of inorganic material to prevent oxygen, water, or the like from being drawn into the first color conversion layer CCL1 and the first and second light emitting elements LD1 and LD2.

An overcoat layer OC may be formed on the fourth insulating layer INS4.

Figure 17:
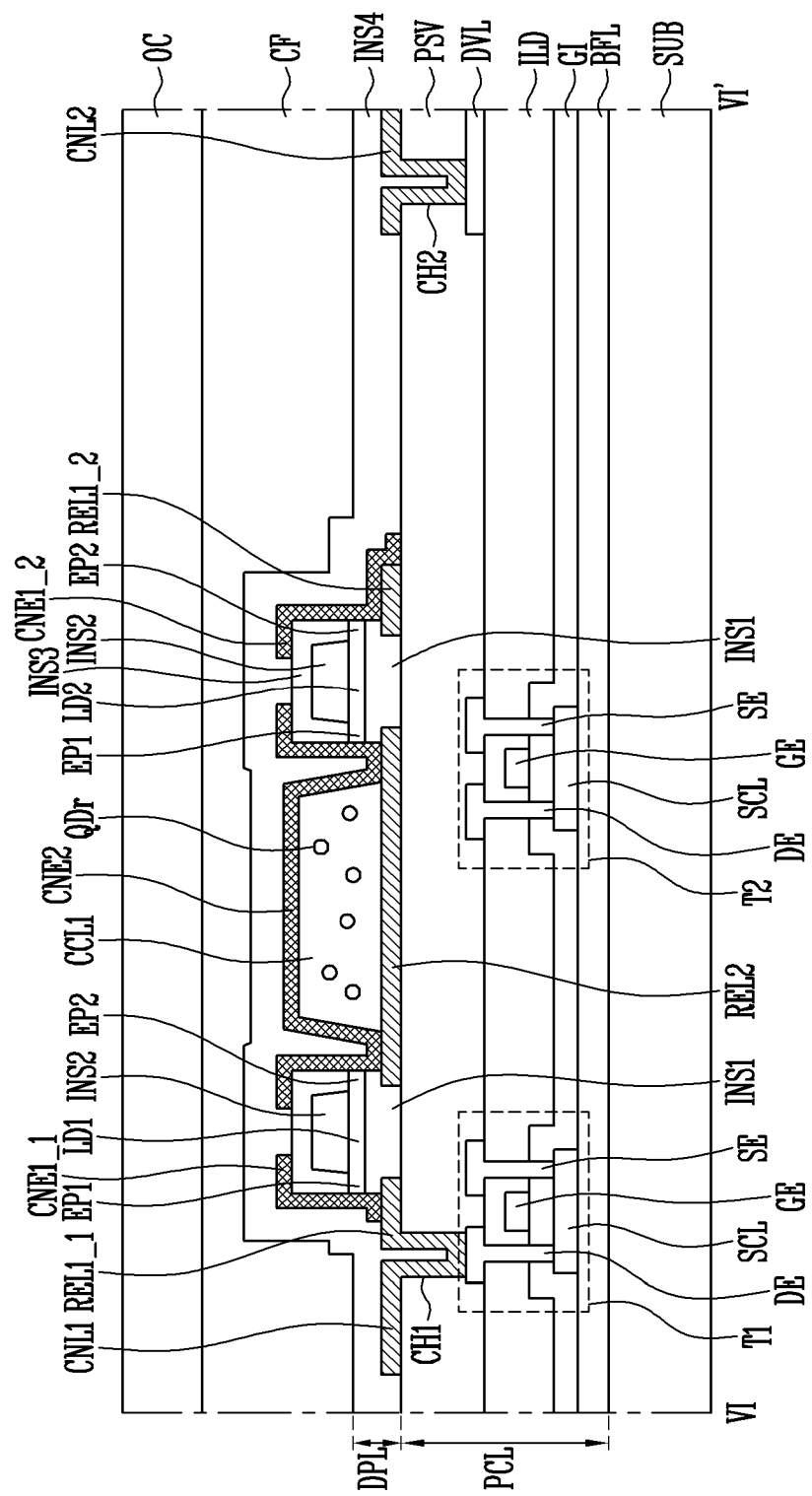
FIG. 17 illustrates a display device in accordance with an embodiment of the present disclosure, and is a sectional diagram corresponding to the line VI-VI' of FIG. 14.

FIG. 17 illustrates a display device in accordance with an embodiment of the present disclosure, and is a sectional diagram corresponding to the line VI-VI' of FIG. 14.

The display device illustrated in FIG. 17, other than the fact that a color filter layer is disposed on a unit emission area of a first sub-pixel, may have a configuration that is substantially the same or similar to that of the display device of FIGS. 14 and 15A.

Therefore, to avoid redundant explanation, the description of the display device of FIG. 17 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 12, 14, and 17, the display device in accordance with an embodiment of the present disclosure may include a substrate SUB on which a plurality of pixels PXL are provided. Each of the pixels PXL may include a first sub-pixel SP1, a second sub-pixel SP2, and a third sub-pixel SP3 which are provided on the substrate SUB. In an embodiment of the present disclosure, the first sub-pixel SP1 may be a red sub-pixel, the second sub-pixel SP2 may be a green sub-pixel, and the third sub-pixel SP3 may be a blue sub-pixel.

The unit emission area 100 of each of the first to third sub-pixels SP1 to SP3 may include the substrate SUB, a pixel circuit layer PCL provided on the substrate SUB, and a display element layer DPL provided on the pixel circuit layer PCL.

The pixel circuit layer PCL of each of the first to third sub-pixels SP1 to SP3 may include a buffer layer BFL disposed on the substrate SUB, transistors T1 and T2 disposed on the buffer layer BFL, a driving voltage line DVL, and a passivation layer PSV disposed on the transistors T1 and T2 and the driving voltage line DVL.

The display element layer DPL of each of the first to third sub-pixels SP1 to SP3 may include a plurality of light emitting elements LD, first and second electrodes REL1 and REL2, first and second connection lines CNL1 and CNL2, first and second contact electrodes CNE1 and CNE2, and color conversion layers CCL1, CCL2, or CCL3.

In an embodiment of the present disclosure, a color filter layer CF may be provided on the display element layer DPL of each of the first to third sub-pixels SP1 to SP3. For example, a first color filter layer CF may be provided on the display element layer DPL of the first sub-pixel SP1. A second color filter layer (not illustrated) may be provided on the display element layer DPL of the second sub-pixel SP2. A third color filter layer (not illustrated) may be provided on the display element layer DPL of the third sub-pixel SP3.

In an embodiment of the present disclosure, the first color filter layer CF may cover the first color conversion layer CCL1 provided on the display element layer DPL of the first sub-pixel SP1. The first color filter layer CF may include a red color filter allowing only red light eventually emitted from the first color conversion layer CCL1 to pass therethrough.

In an embodiment of the present disclosure, the second color filter layer may cover the second color conversion layer CCL2 provided on the display element layer DPL of the second sub-pixel SP2. The second color filter layer may include a green color filter allowing only green light eventually emitted from the second color conversion layer CCL2 to pass therethrough.

In an embodiment of the present disclosure, the third color filter layer may cover the third color conversion layer CCL3 provided on the display element layer DPL of the third sub-pixel SP3. The third color filter layer may include a blue color filter allowing only blue light eventually emitted from the third color conversion layer CCL3 to pass therethrough.

Because the corresponding color filter layers are respectively formed and/or provided on the first to third color conversion layers CCL1 to CCL3, the efficiency of light eventually emitted from each of the first to third color conversion layers CCL1 to CCL3 may be enhanced, and the color may be more clearly expressed.

Furthermore, the corresponding color filter layer provided on each of the first to third color conversion layers CCL1 to CCL3 allows only light having a preset wavelength to pass therethrough and blocks light within the other wavelength range, thus reducing reflection of external light that is incident on the first to third sub-pixels SP1 to SP3.

Furthermore, the corresponding color filter layer may function as a planarization layer for mitigating a stepped portion formed by the display element layer DPL. In this case, the overcoat layer OC may be omitted from the display device.

Figure 18:
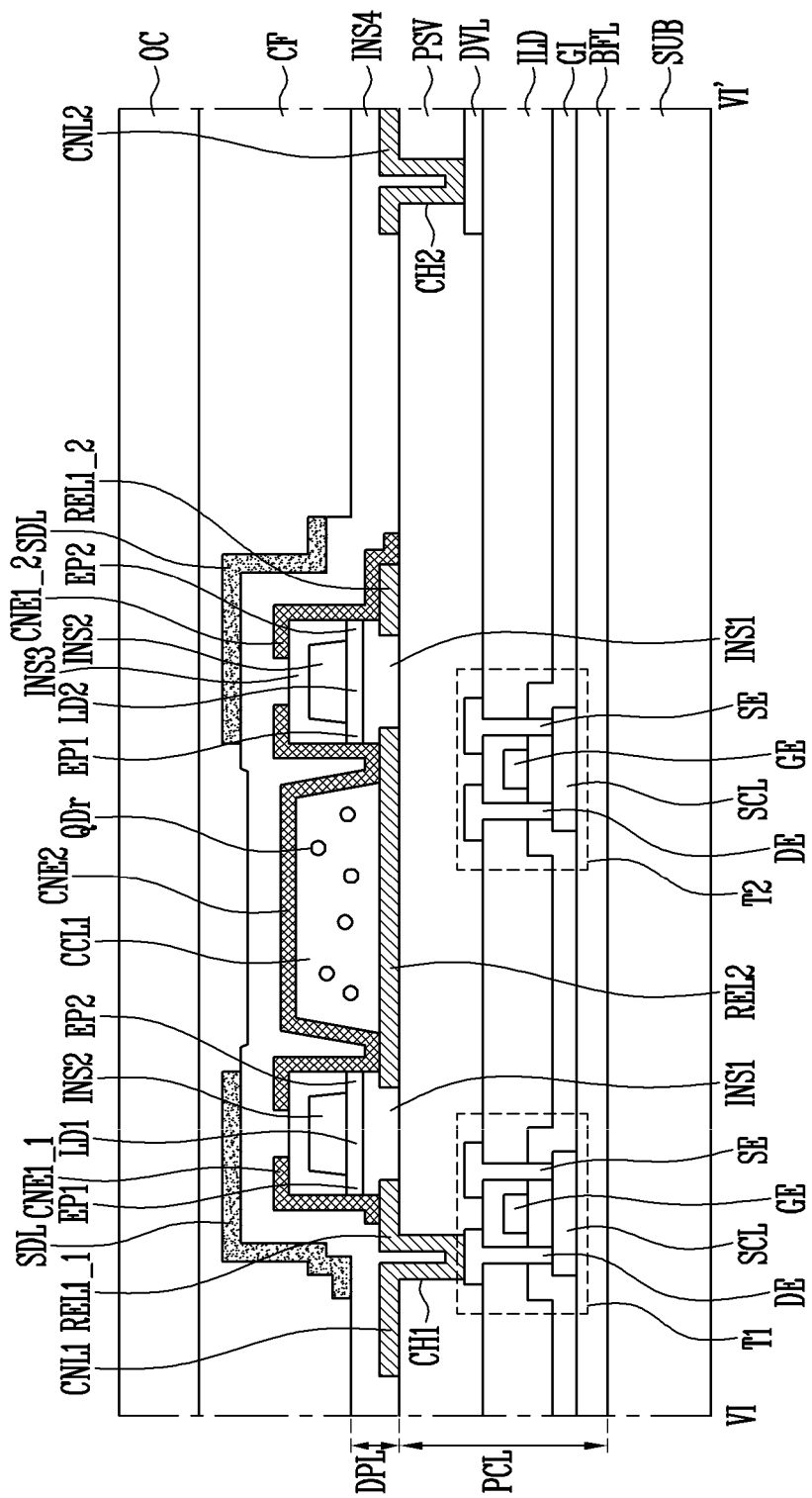
FIG. 18 illustrates a display device in accordance with an embodiment of the present disclosure, and is a sectional diagram corresponding to line the VI-VI' of FIG. 14.

FIG. 18 illustrates a display device in accordance with an embodiment of the present disclosure, and is a sectional diagram corresponding to the line VI-VI' of FIG. 14.

The display device illustrated in FIG. 18, other than the fact that a color filter layer and a shielding layer under the color filter layer are disposed on a unit emission area of a first sub-pixel, may have a configuration that is substantially the same or similar to that of the display device of FIGS. 14 and 17.

Therefore, to avoid redundant explanation, the description of the display device of FIG. 18 will be focused on differences from that of the foregoing embodiments. Components which are not separately explained in the following description of the present embodiment comply with that of the foregoing embodiments. The same reference numeral will be used to designate the same component, and a similar reference numeral will be used to designate a similar component.

Referring to FIGS. 1A, 12, 14, and 18, the display device in accordance with an embodiment of the present disclosure may include a substrate SUB on which a plurality of pixels PXL are provided. Each of the pixels PXL may include a first sub-pixel SP1, a second sub-pixel SP2, and a third sub-pixel SP3 which are provided on the substrate SUB.

The unit emission area 100 of each of the first to third sub-pixels SP1 to SP3 may include the substrate SUB, a pixel circuit layer PCL provided on the substrate SUB, and a display element layer DPL provided on the pixel circuit layer PCL.

In an embodiment of the present disclosure, a shielding layer SDL and a color filter layer CF may be provided on the display element layer DPL of each of the first to third sub-pixels SP1 to SP3.

The shielding layer SDL may be provided on the fourth insulating layer INS4 such that the shielding layer SDL corresponds to the upper surface of each of the light emitting elements LD in the unit emission area 100 of each of the first to third sub-pixels SP1 to SP3. The shielding layer SDL may include a black matrix, and may absorb light rays traveling toward the upper surfaces of the light emitting elements LD among from light rays emitted from the light emitting elements LD, thus preventing the color purity of light eventually emitted from each of the first to third sub-pixels SP1 to SP3 from being degraded.

Furthermore, the shielding layer SDL may absorb light that is incident on each of the first to third sub-pixels SP1 to SP3 from the outside, thus reducing reflection of external light of the display device.

The color filter layer CF may be provided on the shielding layer SDL and the fourth insulating layer INS4 such that the color filter layer CF corresponds to a position over the color conversion layer CCL1, CCL2, or CCL3 of each of the first to third sub-pixels SP1 to SP3.

If the corresponding color filter layer is disposed over the color conversion layer CCL1 to CCL3 of each of the first to third sub pixels SP1 to SP3, the efficiency of light eventually emitted from the color conversion layer CCL1 to CCL3 of each of the first to third sub-pixels SP1 to SP3 may be enhanced, and the color may be more clearly expressed.

While various exemplary embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims.

The invention claimed is:

1. A display device comprising:
    a substrate; and
    a plurality of pixels in a display area of the substrate, wherein each of the plurality of pixels comprises:
    a light emitting element located on the substrate and configured to emit light;
    a first electrode and a second electrode spaced from each other with the light emitting element interposed therebetween;
    a color conversion layer located on the substrate and configured to convert light emitted from the light emitting element into light having a specific color;
    a first contact electrode configured to electrically couple the first electrode with a first end of the light emitting element; and
    a second contact electrode configured to electrically couple the second electrode with a second end of the light emitting element,
    wherein, in a plan view, the color conversion layer is spaced from the light emitting element in a first direction that is perpendicular to a thickness direction of the substrate, and
        wherein the color conversion layer overlaps with at least one of the first and the second contact electrodes.

2. The display device according to claim 1,
    wherein the color conversion layer comprises a quantum dot, and
    wherein the color conversion layer overlaps with the second contact electrode.

3. The display device according to claim 2,
    wherein the color conversion layer is located on the second electrode and overlaps with the second electrode, and
    wherein the second contact electrode is located on the color conversion layer.

4. The display device according to claim 2, wherein the color conversion layer is located on the second contact electrode.

5. The display device according to claim 2, further comprising
    a first connection line extending in a direction and electrically coupled with the first electrode; and
    a second connection line extending parallel to the direction in which the first connection line extends and electrically coupled with the second electrode,
    wherein the second electrode comprises a 2-1-th electrode and a 2-2-th electrode diverging from the second connection line and spaced from each other, and
    wherein the color conversion layer is located on the substrate between the 2-1-th electrode and the 2-2-th electrode.

6. The display device according to claim 2, further comprising a dummy electrode provided between the substrate and the color conversion layer.

7. The display device according to claim 2, further comprising
    a capping insulating layer located on the color conversion layer; and
    a light block pattern located on the capping insulating layer, the light block pattern corresponding to the light emitting element.

8. The display device according to claim 7, wherein the light block pattern comprises a black matrix, and the capping insulating layer comprises an inorganic insulating layer.

9. The display device according to claim 7, further comprising an auxiliary pattern located between the capping insulating layer and the light block pattern, the auxiliary pattern corresponding to the light emitting element.

10. The display device according to claim 2, further comprising:
    a first insulating layer between the substrate and the light emitting element;
    a second insulating layer on the light emitting element and exposing opposite ends of the light emitting element; and a third insulating layer provided on the second insulating layer and covering the light emitting element.

11. The display device according to claim 10, wherein the first contact electrode and the second contact electrode are located on the third insulating layer and spaced from each other.

12. The display device according to claim 10, wherein the first contact electrode and the second contact electrode are located at different layers.

13. The display device according to claim 1, wherein the light emitting element comprises a light emitting diode having a shape of a cylinder or polyprism and having a microscale or nanoscale size.

14. A display device comprising:
a substrate comprising a display area and a non-display area; and
a plurality of pixels in the display area of the substrate, each of the pixels comprising a plurality of sub-pixels,
wherein each of the sub-pixels comprises a pixel circuit layer comprising a transistor, and a display element layer comprising a unit emission area through which light is emitted,
wherein the display element layer comprises:
a light emitting element on the pixel circuit layer and configured to emit light;
a first electrode and a second electrode spaced from each other with the light emitting element interposed therebetween;
a color conversion layer located on the substrate and configured to convert light emitted from the light emitting element into light having a specific color;
a first contact electrode configured to electrically couple the first electrode with a first end of the light emitting element; and
a second contact electrode configured to electrically couple the second electrode with a second end of the light emitting element, and
wherein, in a plan view, the color conversion layer is spaced from the light emitting element in a first direction that is perpendicular to a thickness direction of the substrate, and
wherein the color conversion layer overlaps with at least one of the first and the second contact electrodes.

15. The display device according to claim 14,
wherein the color conversion layer comprises a quantum dot, and
wherein the color conversion layer overlaps with the second contact electrode.

16. The display device according to claim 15,
wherein the color conversion layer is located on the second electrode and overlaps with the second electrode, and
wherein the second contact electrode is located on the color conversion layer.

17. The display device according to claim 15, wherein the color conversion layer is located on the second contact electrode.

18. The display device according to claim 15, further comprising
a first insulating layer between the pixel circuit layer and the light emitting element;
a second insulating layer-on the light emitting element and exposing opposite ends of the light emitting element;
a third insulating layer on the second insulating layer and covering the light emitting element; and
a fourth insulating layer on the third insulating layer,
wherein the first and the second contact electrodes are located on the third insulating layer and spaced from each other.

19. The display device according to claim 18, wherein the display element layer further comprises a color filter layer located on the color conversion layer.

20. The display device according to claim 19, wherein the display element layer further comprises a light block pattern located between the fourth insulating layer and the color filter layer, the light block pattern corresponding to the light emitting element.

* * * * *